(12) United States Patent
Kai et al.

(10) Patent No.: US 8,481,989 B2
(45) Date of Patent: Jul. 9, 2013

(54) SEMICONDUCTOR RESISTIVE RANDOM ACCESS MEMORY DEVICE SUITABLE FOR BIPOLAR ACTION

(75) Inventors: Wakana Kai, Kanagawa-ken (JP); Hirokazu Ishida, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 13/094,278

(22) Filed: Apr. 26, 2011

(65) Prior Publication Data

US 2011/0291063 A1   Dec. 1, 2011

(30) Foreign Application Priority Data

May 26, 2010   (JP) .................................. 2010-120875

(51) Int. Cl.
*H01L 29/02* (2006.01)
(52) U.S. Cl.
USPC ..... 257/2; 257/3; 257/4; 257/5; 257/E29.002; 438/102; 438/103; 438/104
(58) Field of Classification Search
USPC .................... 257/2–5, E29.002; 438/102–104
See application file for complete search history.

(56) References Cited

U.S. PATENT DOCUMENTS

| 2010/0136751 | A1 | 6/2010 | Herner | |
| 2011/0205781 | A1* | 8/2011 | Nakai et al. | 365/148 |

* cited by examiner

*Primary Examiner* — Jami M Valentine
(74) *Attorney, Agent, or Firm* — Oblon, Spivak, McClelland, Maier & Neustadt, L.L.P.

(57) ABSTRACT

According to one embodiment, a semiconductor memory device includes a word line interconnect layer, a bit line interconnect layer and a pillar. The word line interconnect layer includes a plurality of word lines extending in a first direction. The bit line interconnect layer includes a plurality of bit lines extending in a second direction intersecting with the first direction. The pillar is disposed between each of the word lines and each of the bit lines. The pillar has a selector stacked film containing silicon, and a variable resistance film disposed on a side of the word lines or the bit lines. The selector stacked film has a different component-containing layer. The different component-containing layer is formed at one position in a region excluding ends on the sides of the word and bit lines, and contains a 14 group element having a larger atomic radius than an atomic radius of silicon.

16 Claims, 21 Drawing Sheets

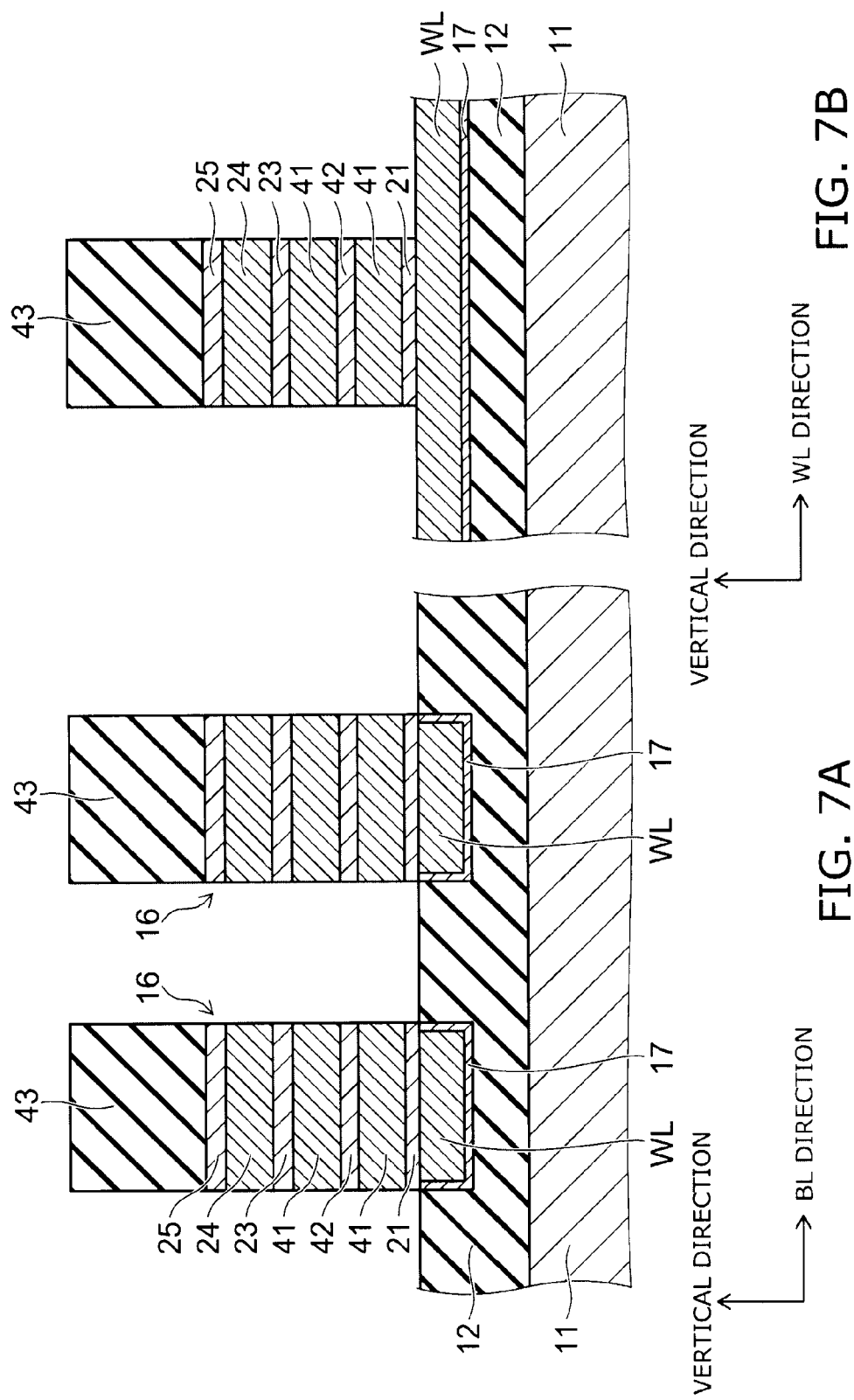

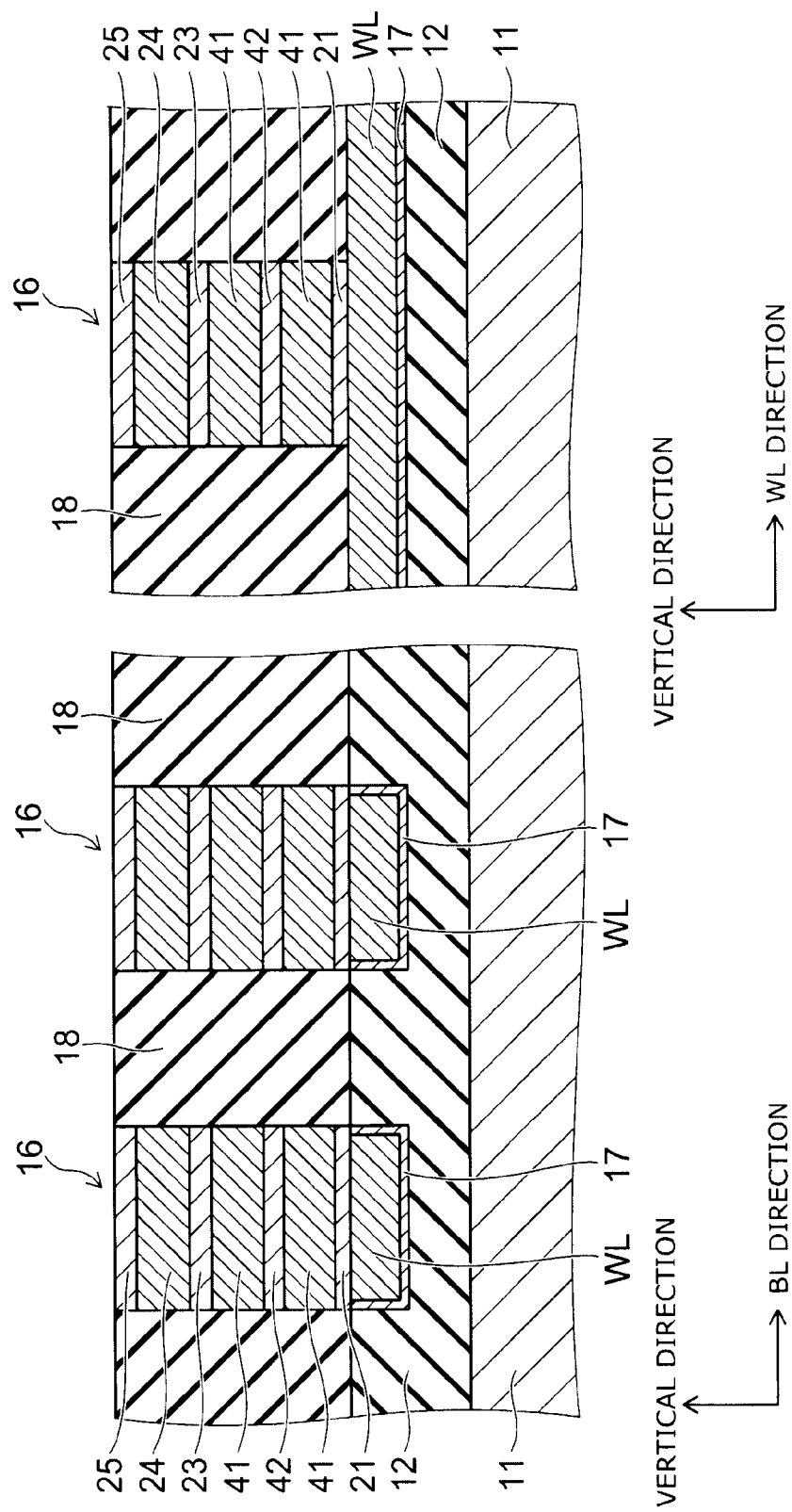

VOLTAGE 0

LOW-VOLTAGE REGION

HIGH-VOLTAGE REGION

VOLTAGE 0

LOW-VOLTAGE REGION

HIGH-VOLTAGE REGION

VOLTAGE 0

LOW-VOLTAGE REGION

HIGH-VOLTAGE REGION

VOLTAGE 0

LOW-VOLTAGE REGION

HIGH-VOLTAGE REGION

VOLTAGE 0

LOW-VOLTAGE REGION

HIGH-VOLTAGE REGION

VOLTAGE 0

LOW-VOLTAGE REGION

HIGH-VOLTAGE REGION

VOLTAGE 0

LOW-VOLTAGE REGION

HIGH-VOLTAGE REGION

US 8,481,989 B2

SEMICONDUCTOR RESISTIVE RANDOM ACCESS MEMORY DEVICE SUITABLE FOR BIPOLAR ACTION

CROSS-REFERENCE TO RELATED APPLICATIONS

This application is based upon and claims the benefit of priority from the prior Japanese Patent Application No. 2010-120875, filed on May 26, 2010; the entire contents of which are incorporated herein by reference

FIELD

Embodiments described herein relate generally to a semiconductor memory device.

BACKGROUND

Research and development of Resistive Random Access Memory (ReRAM) are in progress in recent years as a new memory that becomes a successor candidate of floating gate type NAND flash memory. While the NAND flash memory memorizes information by the number of electrons stored in a floating gate electrode, the ReRAM memorizes information by utilizing the changes in resistance of the recording material. The ReRAM is free from problems accompanied with the refining of MOSFET, including the short-channel effect which raises a problem in memory cell of the NAND flash memory and the proximity effect caused by interaction of accumulated charges. Therefore, the ReRAM is expected as a memory more suitable for refining the device than the conventional NAND flash memory.

In many cases, cell array in the ReRAM has a three-dimensional cross point structure prepared by stacking alternately a word line interconnect layer composed of pluralities of word lines extending in one direction and a bit line interconnect layer composed of pluralities of bit lines extending in another direction, by positioning a pillar between each word line and each bit line, and then by joining a variable resistance element and a selector element in series in each of the pillars. The structure realizes a large capacity non-volatile semiconductor memory device. A selector element is provided in order to prevent current from flowing through the not-selected cell array while the current flows through the selected array.

When a variable resistance element conducts monopolar action, it is only necessary to allow current to flow through the selected array in a forward direction, and also to prohibit current from flowing through the non-selected array in a reverse direction. In that case, it is only necessary for the selector element to be a diode having sufficient rectifying performance; for example, it is only necessary to use a PIN diode or an NIP diode.

When, however, the variable resistance element is caused to perform monopolar action, the load on the variable resistance element becomes heavy because the flowing direction of current is the same in both writing and erasing, which raises a problem of the decrease in the number of write-erase cycles on the variable resistance element. Consequently, the variable resistance element is required to perform the bipolar action. During the bipolar action, the applied current is in an opposite direction from each other in writing and erasing, and thus the load on the variable resistance element is decreased and the number of write-erase cycles can be increased.

When the variable resistance element is caused to perform bipolar action, set voltage or reset voltage is applied to the selected cell arrays in reverse directions from each other, while about half the set voltage or the reset voltage is applied to the non-selected cell arrays. Therefore, the selector element is required to be an element which allows not much current to flow therethrough when the applied voltage is less than a certain value, and which allows large current to flow therethrough when the voltage exceeds the certain value.

BRIEF DESCRIPTION OF THE DRAWINGS

FIGS. 4A to 9B are process cross-sectional views illustrating a method for manufacturing the semiconductor memory device according to the first embodiment;

DETAILED DESCRIPTION

Figure 1:
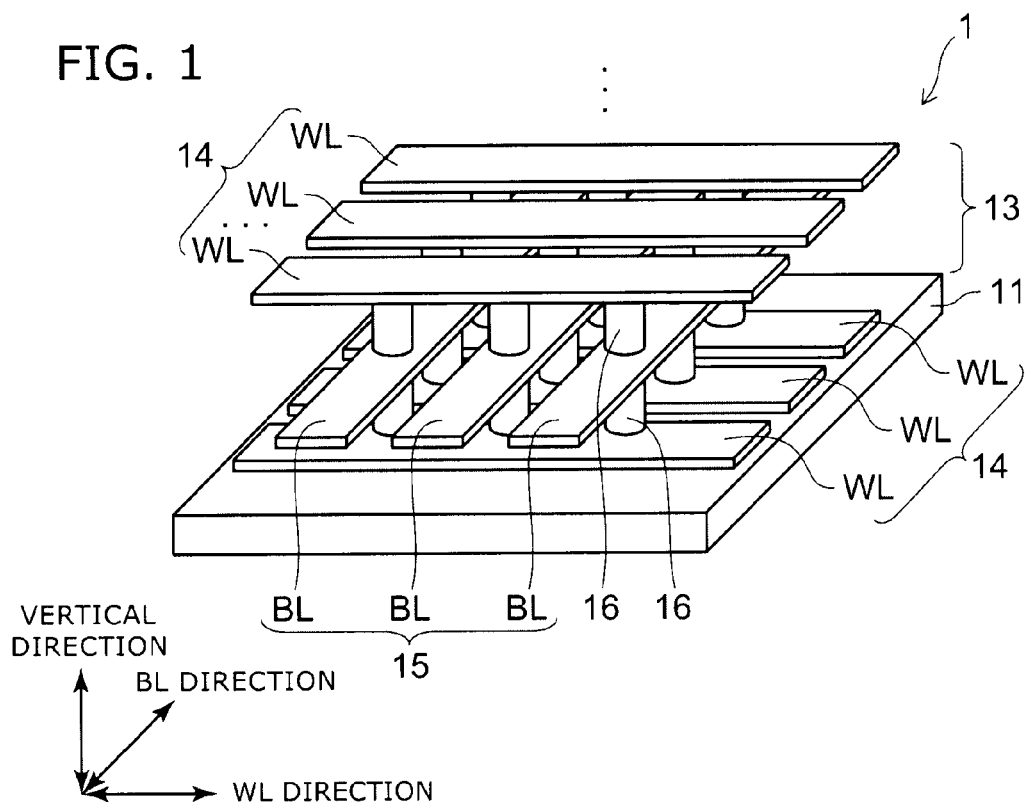
FIG. 1 is a perspective view illustrating a semiconductor memory device according to a first embodiment.

In general, according to one embodiment, a semiconductor memory device includes a word line interconnect layer, a bit line interconnect layer and a pillar. The word line interconnect layer includes a plurality of word lines extending in a first direction. The bit line interconnect layer includes a plurality of bit lines extending in a second direction intersecting with the first direction. The pillar is disposed between each of the word lines and each of the bit lines. The pillar has a selector stacked film containing silicon throughout the selector stacked film, and a variable resistance film disposed on a side of the word lines or the bit lines viewed from the selector stacked film. The selector stacked film has a different component-containing layer. The different component-containing layer is formed at one position in a region excluding an end on the side of the word lines and an end on the side of the bit lines, and contains a 14 group element having a larger atomic radius than an atomic radius of silicon.

In general, according to another embodiment, a semiconductor memory device includes a word line interconnect layer, a bit line interconnect layer and a pillar. The word line interconnect layer includes a plurality of word lines extending in a first direction. The bit line interconnect layer including a plurality of bit lines extending in a second direction intersecting with the first direction. The pillar is disposed between each of the word lines and each of the bit lines. The pillar has a selector stacked film containing silicon throughout the selector stacked film, and a variable resistance film disposed on a side of the word lines or the bit lines viewed from the selector stacked film. The selector stacked film has a different component-containing layer. The different component-containing layer is formed in each of two regions separated from each other excluding an end on the side of the word lines and an end on the side of the bit lines, and contains a 14 group element having a larger atomic radius than an atomic radius of silicon.

In general, according to still another embodiment, a semiconductor memory device includes a word line interconnect layer, a bit line interconnect layer and a pillar. The word line interconnect layer includes a plurality of word lines extending in a first direction. The bit line interconnect layer includes a plurality of bit lines extending in a second direction intersecting with the first direction. The pillar is disposed between each of the word lines and each of the bit lines. The pillar has a selector stacked film containing silicon throughout the selector stacked film, and a variable resistance film disposed on a side of the word lines or the bit lines viewed from the selector stacked film. The selector stacked film has two silicon carbide layers, and a silicon layer disposed between the two silicon carbide layers.

In general, according to still another embodiment, a semiconductor memory device includes a word line interconnect layer, a bit line interconnect layer and a pillar. The word line interconnect layer includes a plurality of word lines extending in a first direction. The bit line interconnect layer includes a plurality of bit lines extending in a second direction intersecting with the first direction. The pillar is disposed between each of the word lines and each of the bit lines. The pillar has a selector stacked film containing silicon throughout the selector stacked film, and a variable resistance film disposed on a side of the word lines or the bit lines viewed from the selector stacked film. The selector stacked film has a different component-containing layer. The different component-containing layer is formed at one position in a region excluding an end on the side of the word lines and an end on the side of the bit lines, and contains an element serving as an acceptor with respect to silicon.

Various embodiments will be described hereinafter with reference to the accompanying drawings.

The description will begin with a first embodiment.

FIG. 1 is a perspective view illustrating a semiconductor memory device according to the embodiment.

Figure 2:
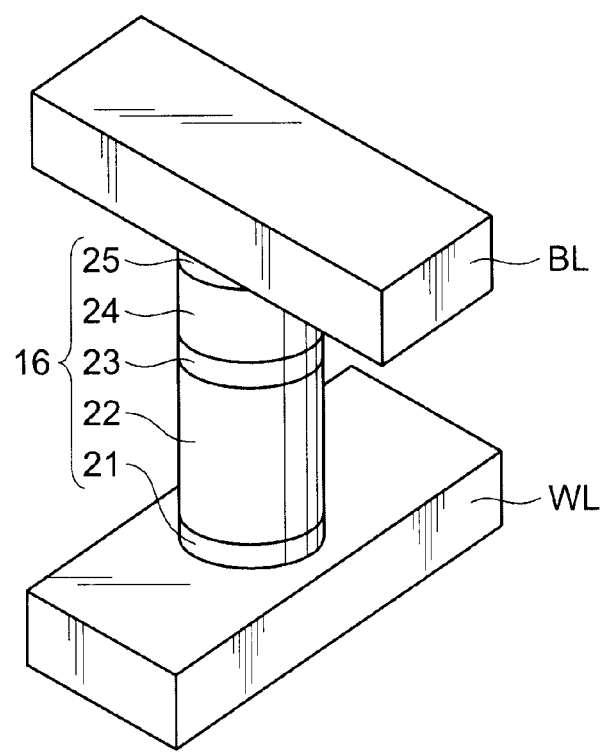
FIG. 2 is a perspective view illustrating a single pillar and surrounding area thereof in the first embodiment.

FIG. 2 is a perspective view illustrating a single pillar and surrounding area thereof in the embodiment.

Figures 3A, 3B:
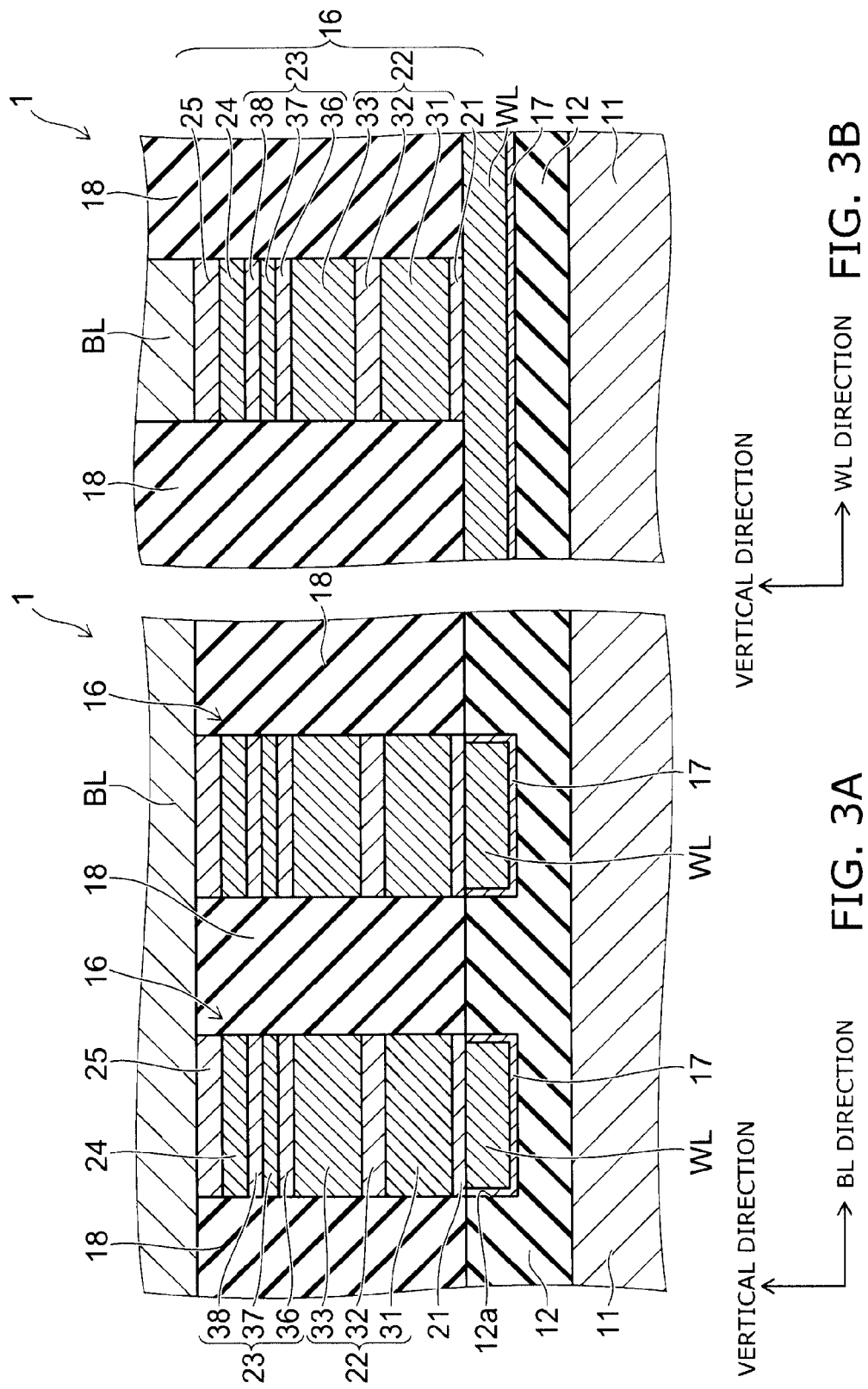
FIGS. 3A and 3B are cross-sectional views illustrating the pillar and surrounding area thereof in the first embodiment.

FIGS. 3A and 3B are cross-sectional views illustrating the pillar and surrounding area thereof in the embodiment; FIG. 3A illustrates a cross section parallel to the BL direction, and FIG. 3B illustrates a cross section parallel to the WL direction.

In FIG. 1 and FIG. 2, only the conduction part is given for convenience of illustration, and the insulation part is not shown.

First, general description of the characteristic parts of the embodiment will be given.

The semiconductor memory device according to the embodiment is a three-dimensional cross point type ReRAM. In this ReRAM, a pillar is joined between a bit line and a word line, thus structuring a memory cell. Each pillar has a variable resistance film and a selector stacked film, both films being joined in series. The selector stacked film is entirely made up of silicon (Si), and forms a different component-containing layer, containing germanium (Ge), at a central part in the direction where the pillar extends. Portions excluding the different component-containing layer in the selector stacked film are formed by a non-doped silicon. With the structure, the selector stacked film has a nonlinear IV characteristic which allows large current to flow therethrough when a certain voltage V is applied in a forward direction or a reverse direction, and which allows very little current to flow therethrough when a voltage (V/2) is applied. As a result, there can be realized a semiconductor memory device suitable for bipolar action.

Next, detail description will be given of the semiconductor memory device according to the embodiment.

As illustrated in FIGS. 1 to 3B, a semiconductor memory device 1 according to the embodiment has a semiconductor substrate 11, and a drive circuit (not shown) of the semiconductor memory device 1 is formed at upper layer part and on the top surface of the semiconductor substrate 11. In the drive circuit, there are formed a selection transistor for selecting an arbitrary memory cell, a resistance element, or the like. On the semiconductor substrate 11, an interlayer insulating film 12 is formed so as to bury the drive circuit therein, and a memory part 13 is positioned on the interlayer insulating film 12.

In the memory cell part 13, there are stacked alternately a word line interconnect layer 14 containing pluralities of word lines WL extending in one direction parallel to the top surface of the semiconductor substrate 11 (hereinafter referred to as the "WL direction"), and a bit line interconnect layer 15 containing pluralities of bit lines BL extending in the direction of intersecting with the WL direction, for example orthogonal to the WL direction, parallel to the top surface of the silicon substrate 11 (hereinafter referred to as the "BL direction"), via an insulating layer. Meanwhile, although FIG. 1 gives two layers of the word line interconnect layer 14 and only one layer of the bit line interconnect layer 15, each of the word line interconnect layer 14 and the bit line interconnect layer 15 may be stacked with three layers or more. Word lines WL do not contact each other, bit lines BL do not contact each other, and word line WL and bit line BL do not contact each other. The word line WL at lowermost layer in the memory cell part 13 is buried in a groove 12a formed on top surface of the interlayer insulating film 12. A bimetal film 17 is formed on inside surface of the groove 12a, or between the inside surface of the groove 12a and the word line WL at lowermost layer.

Further, at the most proximity point between each word line WL and each bit line BL, there is positioned a pillar 16 extending in the vertical direction relative to the top surface of the semiconductor substrate 11 (hereinafter referred to as the "vertical direction"). The pillar 16 is formed between the word line WL and the bit line BL. A single pillar 16 structures a single memory cell. The word line WL, the bit line BL, and the pillar 16 are buried in the interlayer insulating film 18.

The structure of the pillar 16 will be described below referring to FIG. 2 and FIGS. 3A and 3B.

The pillar 16 has two types: the one in which the word line WL is positioned at lower part thereof, and the bit line BL is positioned at upper part thereof; the other in which the bit line BL is positioned at lower part thereof, and the word line WL is positioned at upper part thereof. FIG. 2 and FIGS. 3A and 3B illustrate the pillar in which the word line WL is positioned at lower part thereof, and the bit line BL is positioned at upper part thereof. In that type of pillar 16, there are stacked, in order from the bottom (word line side) to the top (bit line side), a barrier metal film 21, a selector stacked film 22, a lower electrode film 23, a variable resistance film 24, and an upper electrode film 25. The lower electrode film 21 contacts with the word line WL, while the upper electrode film 25 contacts with the bit line BL. Meanwhile, a contact layer may be formed between the upper electrode film 25 and the bit line BL.

The selector stacked film 22 is structured by pluralities of silicon-containing layers stacked in the vertical direction. According to the first embodiment, the selector lamination film 22 is structured by stacking, in order from bottom to top, a non-doped silicon (Si) layer, a silicon-germanium (SiGe) layer 32, and a non-doped silicon layer 33. That is, entire selector stacked film 22 contains silicon, and the silicon-germanium layer 32 as the different component-containing layer is formed at one position in a part of domain excluding the lower end part and the upper end part of the selector stacked film 22. The crystal structure of the non-doped silicon layers 31 and 33 and of the silicon-germanium layer 32 is a polycrystalline structure. Furthermore, for example, the silicon-germanium layer 32 is positioned in a portion including the center in the vertical direction of the selector stacked film 22.

Materials of the respective parts will be given below as examples.

The semiconductor substrate 11 is made of for example silicon. The interlayer insulating films 12 and 18 are made of, for example, silicon oxide ($SiO_2$). The word line WL and the bit line BL are made of a material having high resistance to heat and high resistivity, such as tungsten (W), tungsten silicide (WSi), nickel silicide (NiSi), and cobalt silicide (CoSi). The barrier metal films 17 and 21 are made of, for example, titanium (Ti), titanium nitride (TiN), and tantalum nitride (TaN).

The lower electrode film 23 is a three-layer film stacked by, in order from bottom to top, a titanium silicide (TiSi) layer 36, a titanium (Ti) layer 37, and a titanium nitride (TiN) layer 38. The upper electrode film 25 is made of, for example, titanium nitride (TiN). Meanwhile, the lower electrode film 23 and the upper electrode film 25 may be made of, for example, platinum (Pt), gold (Au), ruthenium (Ru), rhodium (Rh), silver (Ag), iridium (Ir), cobalt (Co), titanium (Ti), aluminum (Al), titanium nitride (TiN), tantalum nitride (TaN), ruthenium nitride (RuN), titanium-aluminum nitride (TiAlN), tantalum-aluminum nitride (TaAlN), strontium-ruthenium oxide (SrRuO), lanthanum-nickel oxide (LaNiO), platinum-iridium oxide ($PtIrO_x$), and platinum-rhodium oxide ($PtRhO_x$).

The variable resistance film 24 is structured by a metal oxide film having two levels of resistance, such as a metal oxide film composed of hafnium oxide (HfO), nickel oxide (NiO) or manganese oxide (MnO).

The above-mentioned structure is also similar to that of the pillar 16 having a bit line BL at lower part thereof and a word line WL at upper part thereof. In the selector stacked film 22, however, there is a case where the silicon-germanium layer 32 is positioned at an offset position from the center in the vertical direction. In that case the pillar 16 having the bit line BL at lower part thereof has a vertical reversed structure of the selector stacked film 22 compared with the structure of the pillar 16 having the word line WL at lower part thereof.

Next, the description will be given of a method for manufacturing the semiconductor memory device according to the embodiment.

FIGS. 4A to 9B are the process cross-sectional views illustrating the method for manufacturing the semiconductor memory device according to the embodiment. Drawing A of the respective figures shows a cross section parallel to the BL direction, and drawing B of the respective figures shows a cross section parallel to the WL direction.

Figures 4A, 4B:
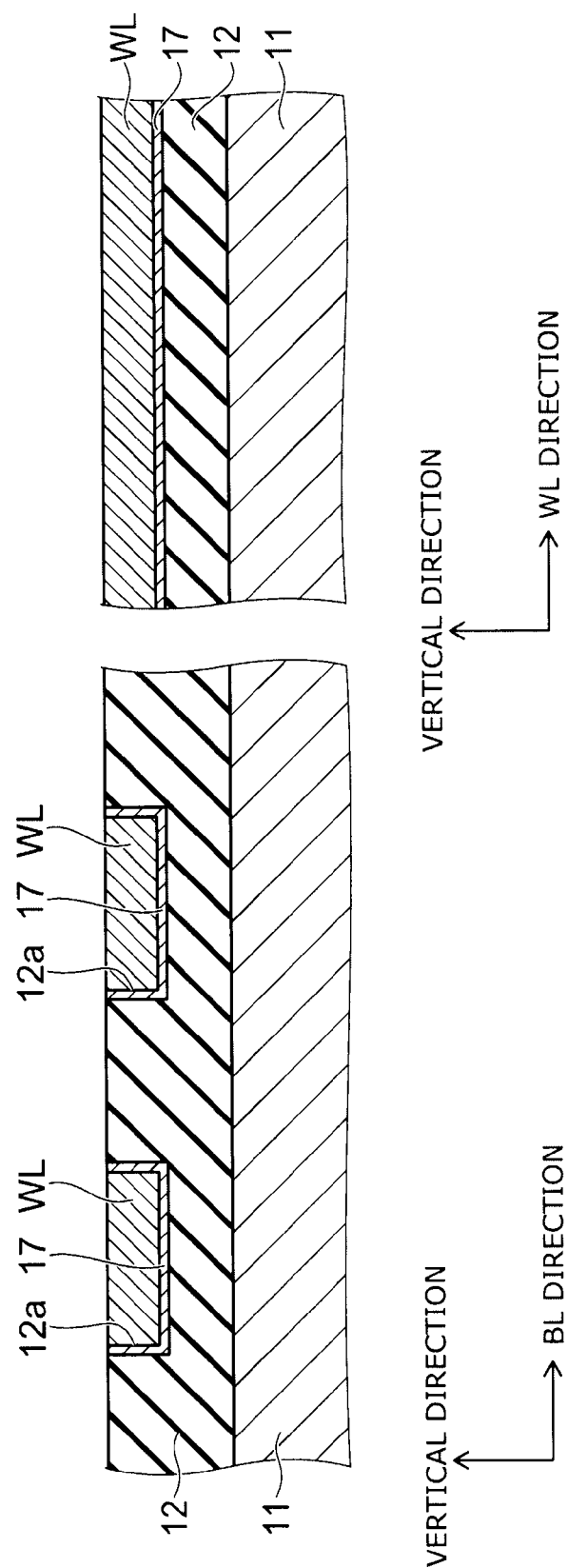

As illustrated in FIGS. 4A and 4B, a drive circuit (not shown) is formed on top surface of the semiconductor substrate 11. Then, silicon oxide, for example, is deposited on the semiconductor substrate 11 so as to bury the drive circuit therein, thus forming the interlayer insulating film 12 having a thickness of, for example, about 400 nm. Next, a resist film (not shown) is formed on the entire surface of the interlayer insulating film 12, followed by patterning thereof to form a resist pattern (not shown). Then, etching is applied using the resist pattern as the mask to remove a part of the upper layer of the interlayer insulating film 12, and thus pluralities of grooves 12a extending in the WL direction are formed. After that, the resist pattern is removed. As a result, the word line interconnect layer 14 is formed.

Next, titanium nitride (TiN), for example, is deposited to form the barrier metal film 17 on the inside surface of the groove 12a. Then, tungsten (W), for example, is deposited to bury the groove 12a. After that, chemical mechanical polishing (CMP) is applied using the interlayer insulating film 12 as the stopper to remove the tungsten and the titanium nitride deposited on the top surface of the interlayer insulating film 12. As a result, the word line WL is formed in the groove 12a.

Figures 5A, 5B:
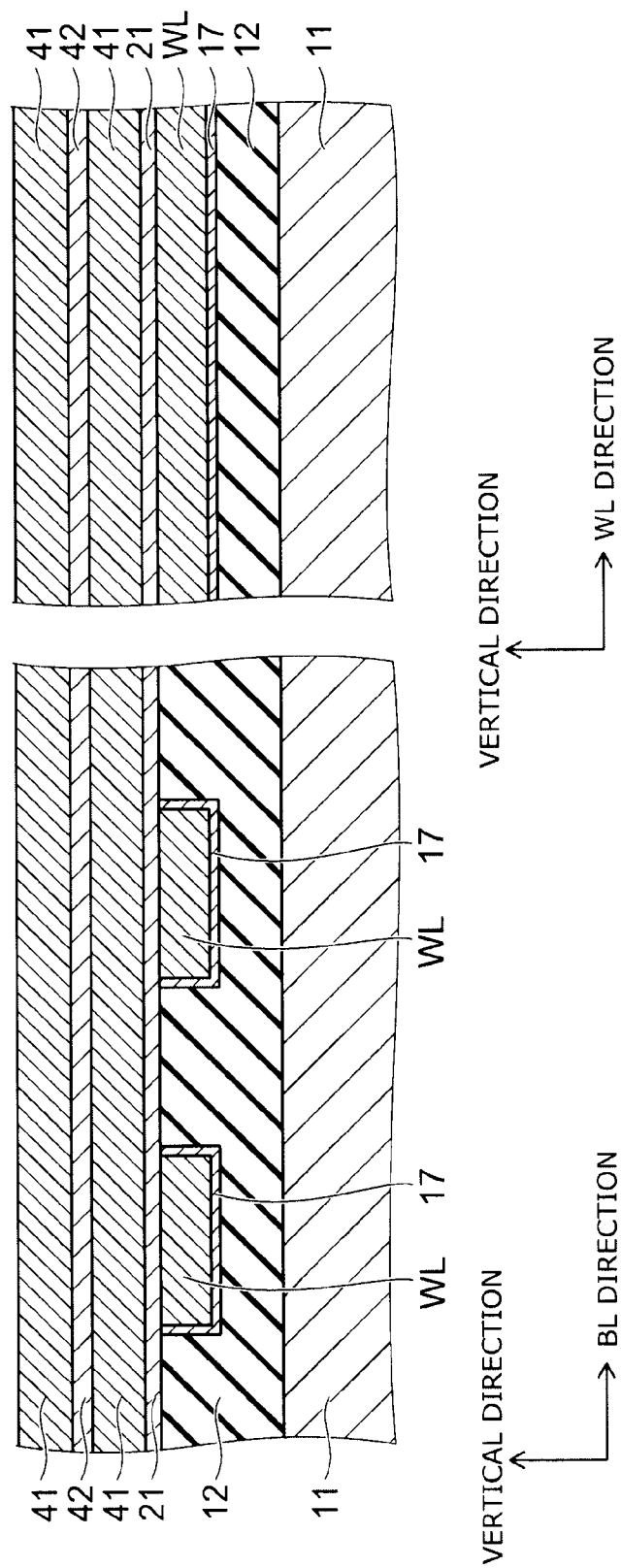

Next, as illustrated in FIGS. 5A and 5B, on the interlayer insulating film 12 and the word line WL, there is formed the barrier metal film 21 having a thickness of several nanometers, made of, for example, titanium nitride (TiN). Then, there is formed a non-doped amorphous silicon film 41 with a thickness of about 50 to 130 nm. Next, ion implantation is performed to implant germanium into a part of a portion distant from the top surface and bottom face of the amorphous silicon film 41, for example, into the center part in the vertical direction. Thus, an amorphous silicon-germanium layer 42 is formed in the non-doped amorphous silicon film 41.

Figures 6A, 6B:
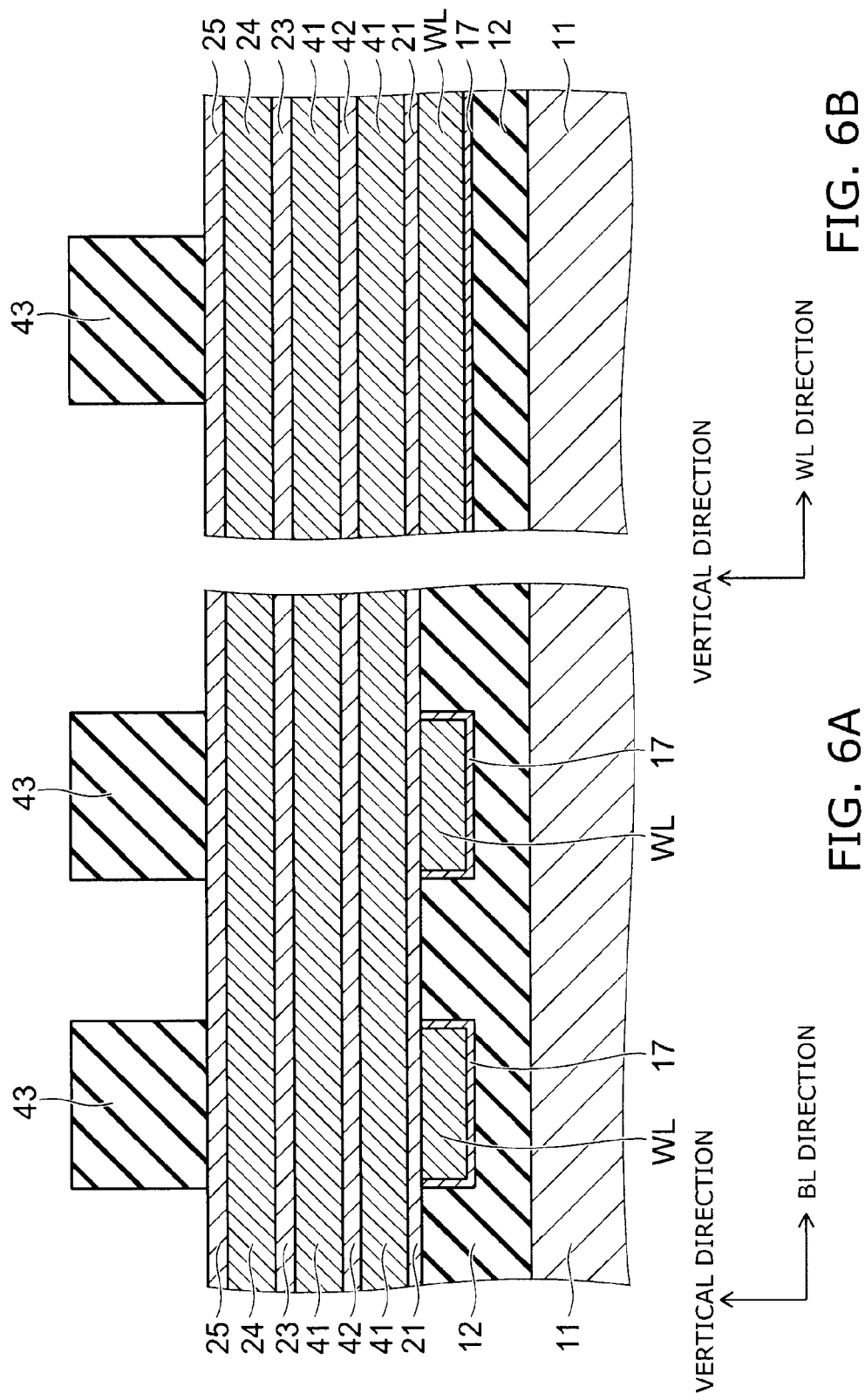

Then, as illustrated in FIGS. 6A and 6B, on the amorphous silicon film 41, there are formed the titanium silicide layer 36, the titanium layer 37, and the titanium nitride layer 38, (refer to FIGS. 3A and 3B), in this order. As a result, the lower electrode film 23 composed of the above-described three-layer film is formed. Next, the variable resistance film 24 is formed by forming, for example, a hafnium oxide film to a thickness of about 10 nm. Then, tungsten is deposited to form the upper electrode film 25 having a thickness of several nanometers. After that, a mask-material film 43 composed of stacked film containing silicon oxide film and the like is formed.

Next, a resist film is formed on the entire surface, followed by patterning to form a resist pattern (not shown). The resist pattern is formed in a matrix pattern in a domain where the pillar 16 (refer to FIG. 1) is to be formed. Then, etching is applied using the resist pattern as the mask to give patterning to the mask-material film 43.

Next, as illustrated in FIGS. 7A and 7B, the patterned mask-material film 43 is used as the mask to perform reactive ion etching (RIE), and thus the upper electrode 25, the variable resistance film 24, the lower electrode film 23, the amorphous silicon film 41 including the silicon germanium layer 42, and the barrier metal film 21 are selectively removed. Thus the pillar 16 is formed. The resist pattern vanishes during the RIE.

Next, as illustrated in FIGS. 8A and 8B, silicon oxide is buried in between pillars 16. Then, the upper electrode 25 of the pillar 16 is used as the stopper to apply CMP to flatten the top surface. Thus, the interlayer insulating film 18 made of silicon oxide is formed between the pillars 16. At this time, the remaining mask-material film 43 (refer to FIGS. 7A and 7B) is also removed.

Figures 9A, 9B:
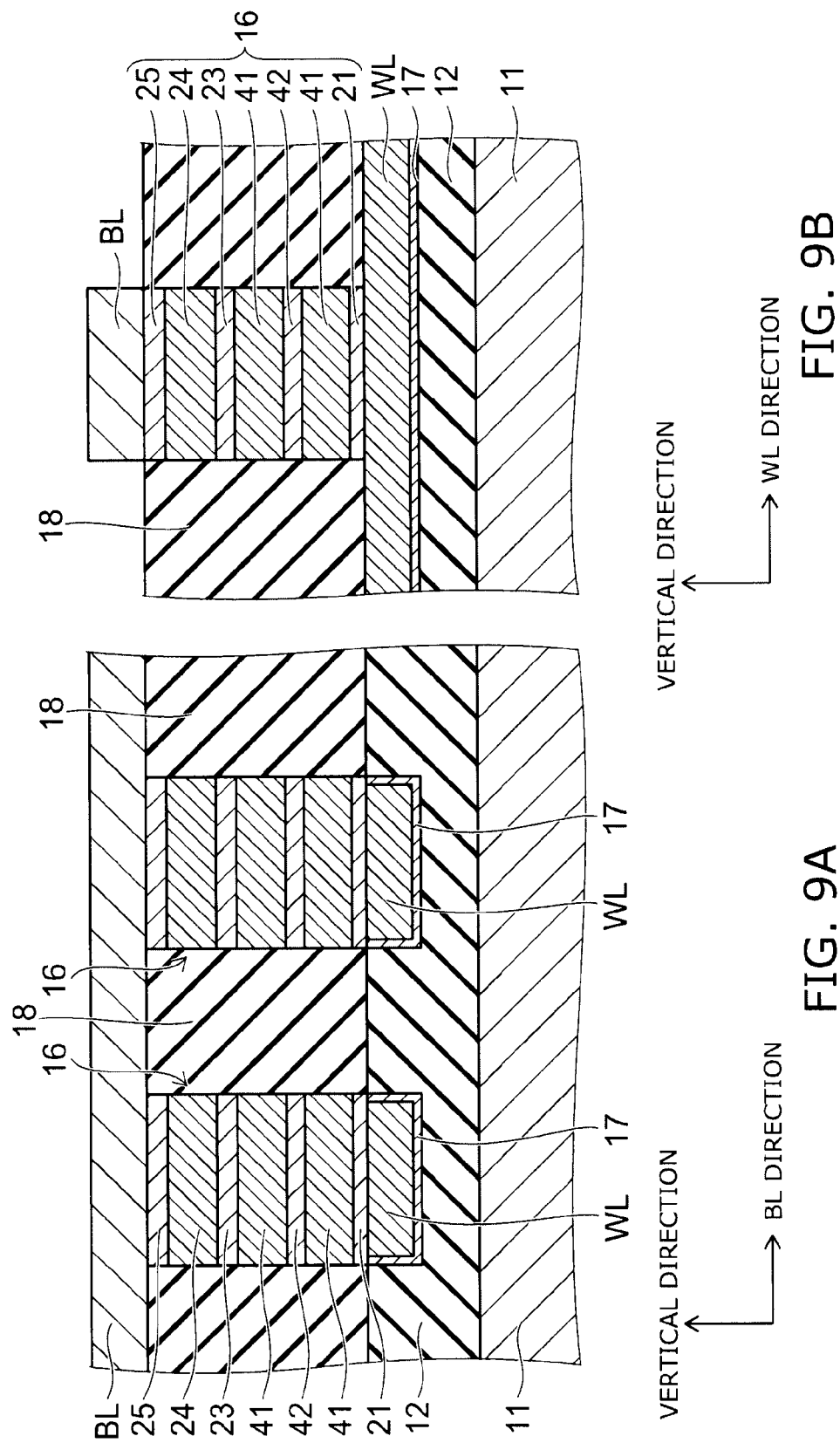

Next, as illustrated in FIGS. 9A and 9B, a conductive film is formed by depositing, for example, tungsten, and a resist pattern (not shown) is formed thereon. Then, etching is applied using the resist pattern as the mask to execute patterning of the conductive film. As a result, the bit line BL made of for example tungsten is formed. After that, the resist pattern is removed to form the bit line interconnect layer 15.

Next, heat treatment is performed in, for example, nitrogen atmosphere for about 30 seconds at about 800° C. The heat treatment crystallizes the amorphous silicon film 41 to polysilicon. As a result, as illustrated in FIGS. 3A and 3B, the amorphous silicon-germanium layer 42 becomes the polycrystalline silicon-germanium layer 32, and the portions other than the silicon-germanium layer 42 in the amorphous silicon film 41 become polycrystalline non-doped silicon layers 31 and 32.

Then, with a similar method of forming the above pillar 16, the pillar 16 is formed on the bit line BL. Next, the interlayer insulating film 18 is buried in between the pillars 16. After that, with similar method of forming the bit line BL, the word line WL is formed on the pillar 16. By repeating the similar process, the memory cell part 13 is formed. By this procedure, the semiconductor memory device 1 illustrated in FIGS. 1 to 3B is produced.

Next, a description will be given of the operation of the semiconductor memory device of the embodiment.

Figure 10:
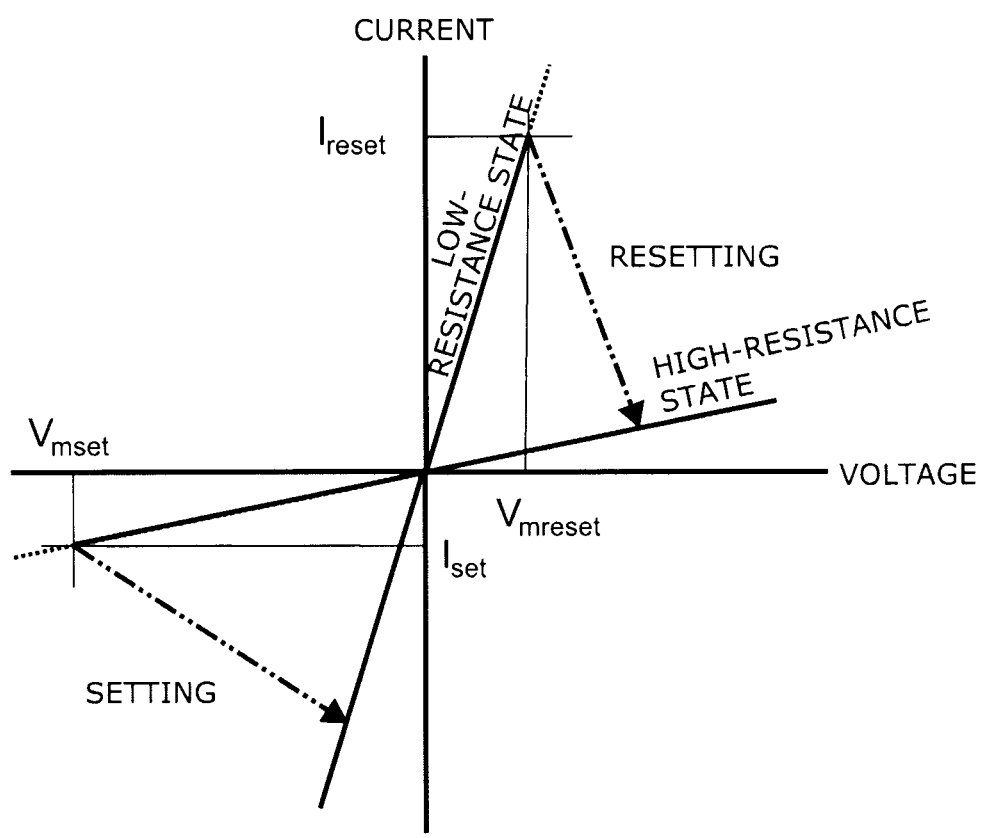
FIG. 10 is a graph illustrating the operation of a variable resistance film in the first embodiment.

FIG. 10 is a graph illustrating the operation of the variable resistance film in the embodiment; the horizontal axis is the voltage, and the vertical axis is the current.

Figure 11:
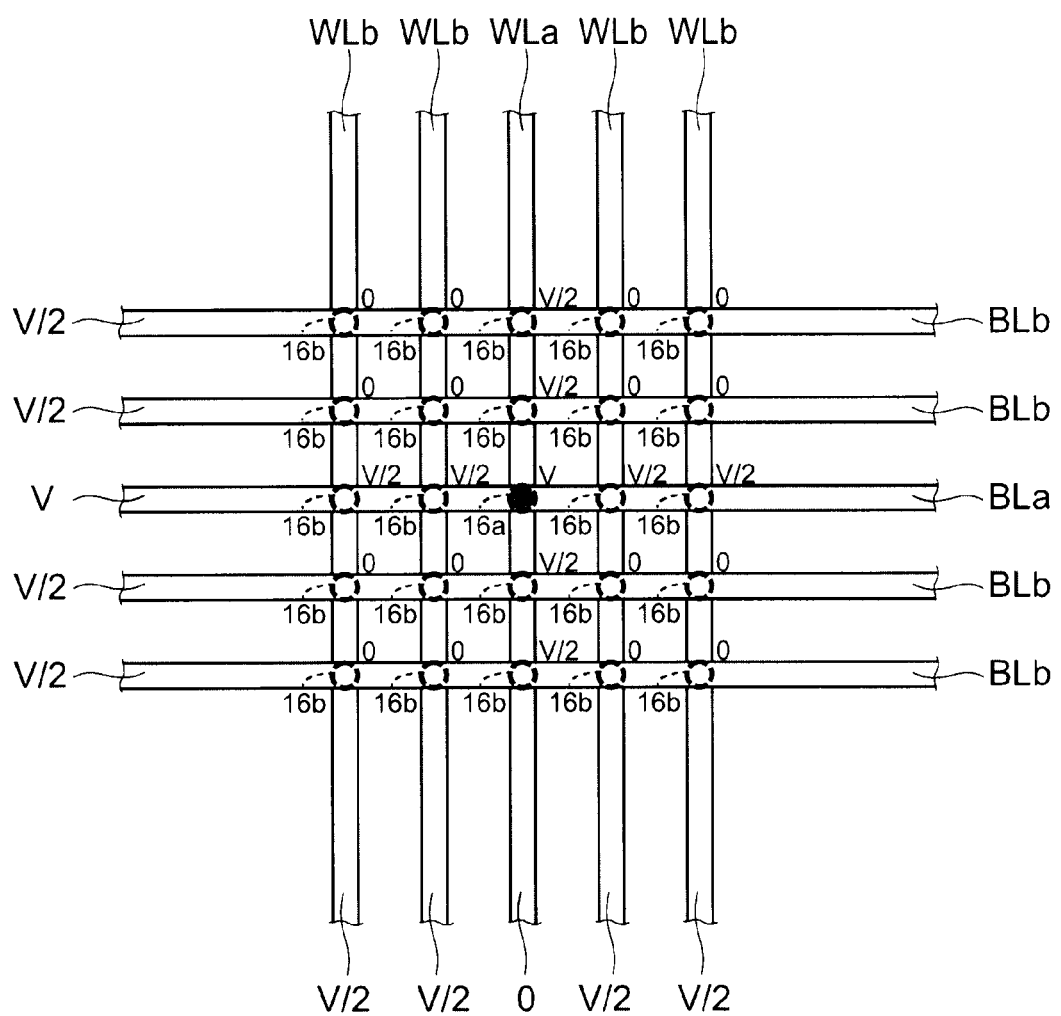
FIG. 11 is a schematic circuit diagram illustrating a method of selecting the variable resistance film.

FIG. 11 is a schematic circuit diagram illustrating a method of selecting the variable resistance film.

Figure 12:
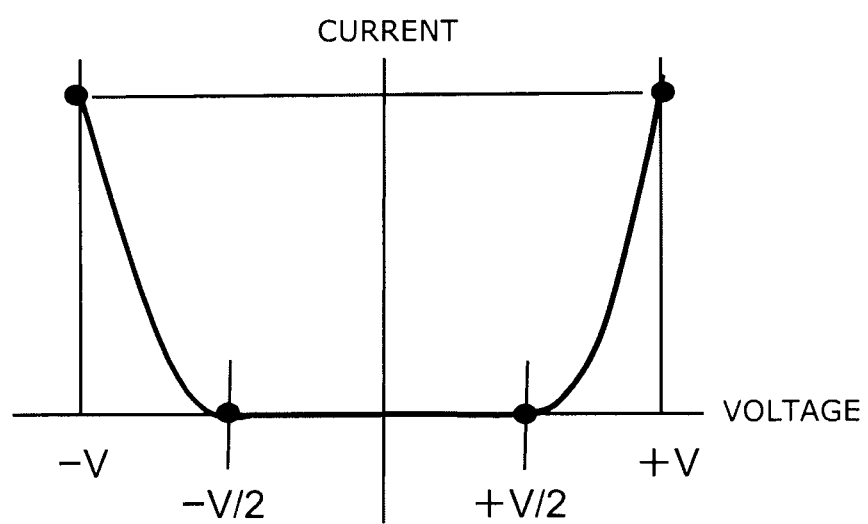
FIG. 12 is a graph of schematically illustrating characteristics of the selector stacked film in the first embodiment.

FIG. 12 is a graph schematically illustrating characteristics of the selector stacked film in the embodiment; the horizontal axis is the voltage, and the vertical axis is the absolute value of the current.

Figure 13A:
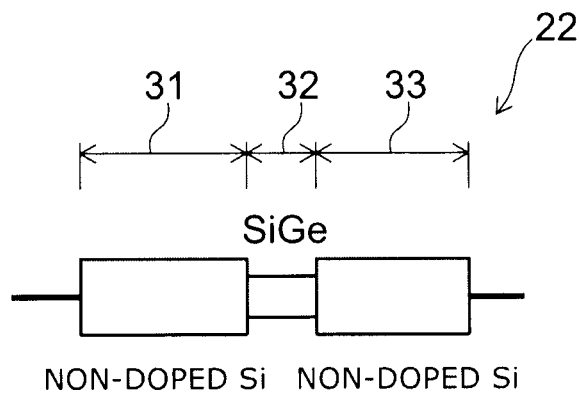
FIGS. 13A to 13C are schematic band diagrams illustrating the operation of the selector stacked film in the first embodiment.
Figure 13B:
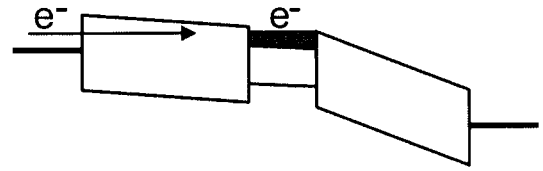
Figure 13C:
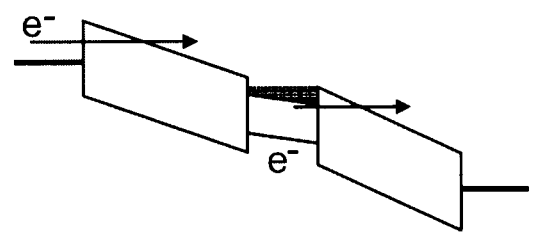

FIGS. 13A to 13C are schematic band diagrams illustrating the operation of the selector stacked film in the embodiment; the horizontal axis is the position in the vertical direction, and the vertical axis is the energy. FIG. 13A is the case where the applied voltage is 0 (zero), FIG. 13B is the case where the applied voltage is low, and FIG. 13C is the case where the applied voltage is high.

The description begins with a method of driving the variable resistance film 24 in the embodiment.

As illustrated in FIG. 10, when the metal oxide film structuring the variable resistance film 24 is in a high-resistance state, and if a negative set-voltage $V_{mset}$ is applied to the variable resistance film 24 via the word line WL and the bit line BL to thereby apply a set-current $I_{set}$ therethrough, the condition of the variable resistance film 22 moves from the high-resistance state to the low-resistance state. This operation is called the "setting". In contrast to this, when the variable resistance film 24 is in a low-resistance state, and when a positive reset-voltage $V_{mreset}$ is applied to the variable resistance film 24 to thereby apply a reset-current $I_{reset}$ therethrough, the condition of the variable resistance film 24 moves from the low-resistance state to the high-resistance state. The operation is called the "resetting". By the operation, the resistance state of the variable resistance film 24 is selected from either the "high-resistance state" or the "low-resistance state", and thus the variable resistance film 24 can memorize binary data.

Next, a description will be given of a method of selecting an arbitrary variable resistance film 24 among variable resistance films 24 arranged in a matrix pattern.

As illustrated in FIG. 11, a potential V is applied to a bit line BL connected to a selecting pillar 16 (hereinafter the bit line BL is referred to as the "selected bit line BLa", and the selecting pillar 16 is referred to as the "selected pillar 16a"), while a potential (V/2) is applied to other bit lines BL, (hereinafter referred to as the "non-selected bit lines BLb"). A potential 0 (zero) is applied to a word line WL connected to the selected pillar 16a, (hereinafter referred to as the "selected word line WLa"), while a potential (V/2) is applied to other word lines WL, (hereinafter referred to as the "non-selected word lines WLb"). As a result, a voltage V is applied to the selected pillar 16a. Among the non-selected pillars 16 (hereinafter referred to as the "non-selected pillars 16b"), a voltage (V/2) is applied to the pillar connected to the selected bit line BLa or the selected word line WLa. Furthermore, among the non-selected pillars 16b, voltage 0 is applied to a pillar connected to the non-selected bit line BLb and the non-selected word line WLb in between them.

In this case, as illustrated in FIG. 12, if the selector stacked film 22 is an element which allows very little current to flow therethrough when the voltage (V/2) is applied, and allows a large current to flow therethrough when the voltage V is applied, the selected pillar 16a allows the set-current $I_{set}$ or the reset current $I_{reset}$ to flow therethrough, while the non-selected pillar 16b allows very little current to flow therethrough. As a result, only the variable resistance film 24 positioned on the selected pillar 16 can execute the set operation or the reset operation. As illustrated in FIG. 10, since voltage is applied to both the positive electrode and the negative electrode of the pillar 16, the characteristics of the selector stacked film 22 are required to be bipolar as illustrated in FIG. 12.

Further, according to the embodiment, the selector stacked film adopts the selector stacked film 22 structured by the silicon-germanium layer 32 being sandwiched between the non-doped silicon layer 31 and the non-doped silicon layer 33. Since germanium is the same 14 group element as silicon, germanium atom can replace the silicon atom to occupy a lattice point of silicon crystal. However, since the atomic radius of germanium is larger than that of silicon, the germanium atom deforms the surrounding crystal lattice. Thus, as illustrated in FIG. 13A, in the silicon-germanium layer 32, there appears a level at which electrons can exist. In addition, since the silicon-germanium layer 32 contains germanium at a relatively high concentration, the band gap of the silicon-germanium layer 32 becomes narrower than that of the non-doped silicon layer 32.

As illustrated in FIG. 13B, when a low voltage of about the above-described voltage (V/2) is applied to the selector stacked film 22, electrons are accumulated at a level in the silicon-germanium layer 32. The electron accumulation also occurs in the silicon-germanium layer 32 because of the difference in the band gap between the silicon-germanium layer 32 and the non-doped silicon layers 31 and 33. As a result, the energy level with respect to the electrons in the silicon-germanium layer 32 increases, which makes the current difficult to flow. Consequently, the amount of flowing current can be suppressed at the time of applying low voltage. In this case, higher germanium concentration in the silicon-germanium layer 32 results in narrower band gap of the silicon-germanium layer 32, which allows accumulating large number of electrons. As a result, the energy level in the silicon-germanium layer 32 increases to thereby allow suppressing further effectively the current flow. Therefore, in the first embodiment, higher germanium concentration in the silicon-germanium layer 32 is more preferable.

In contrast, as illustrated in FIG. 13C, when a high voltage such as approximately the above-described voltage V is applied to the selector stacked film 22, the energy level in the non-doped silicon layer 33 at an end part of the silicon-germanium layer 32 side becomes lower than the energy level in the silicon-germanium layer 32 at an end part of the non-doped silicon layer 31 side, which results in making it difficult to accumulate electrons. As a result, electrons begin to flow from the silicon-germanium layer 32 toward the non-doped silicon layer 33. In addition, since the band of entire selector lamination layer 22 tilts further, the effect of increasing the energy level of the silicon-germanium layer 32 to higher energy side becomes relatively smaller. Furthermore, since the band width of the silicon-germanium layer 32 is narrower than that of the non-doped silicon layers 31 and 33, the tunneling probability increases to allow the tunnel current to easily flow because of the existence of the silicon-germanium layer 32 between the non-doped silicon layer 31 and the non-doped silicon layer 33. As a result, the amount of current at the time of applying high voltage can be increased.

Next, a description will be given of the effect of the embodiment.

In the embodiment, the selector stacked film 22 can realize the IV characteristics through the above operation, as illustrated in FIG. 12. That is, when applying a low voltage, very little current is allowed to flow through the selector stacked film 22, and when applying high voltage, a large current is allowed to flow therethrough. As a result, the bipolar action can drive the variable resistance film 24.

Note that it is considered that such bipolar selector stacked film also makes use of an element of PNP type or NPN type. The PNP type element and the NPN type element, however, require stacking three impurity layers. In consideration of the diffusion of impurities, the reduction in the stacking height becomes difficult. Accordingly, if the above selector stacked film 22 is substituted by a PNP type element or an NPN type element, the height of the pillar becomes excessively large, which makes the processing of pillar difficult. In addition, since the PNP type element and the NPN type element utilize the punch-through effect to steeply increase the current, there arises a problem of variation in start-up voltage.

In contrast to this, according to the embodiment, in the selector stacked film 22, only one layer of silicon-germanium layer is formed in the non-doped silicon layer, and thus, the stacking height can be decreased. As a result, also the height of the pillar 16 can be decreased, which allows easy processing. Furthermore, since the selector stacked film 22 controls the quantity of current by utilizing the tunnel effect, variation becomes small and control becomes easy.

Moreover, since in the embodiment, the polarities of set-voltage and reset-voltage are opposite to each other, voltage in both directions is applied to the variable resistance film 24, which suppresses damage of the variable resistance film 24. Therefore, in comparison with applying voltage only in one direction, the practically available number of switching cycles can be increased.

Next, a description will be given of a variation of the first embodiment.

Figures 14A, 14B:
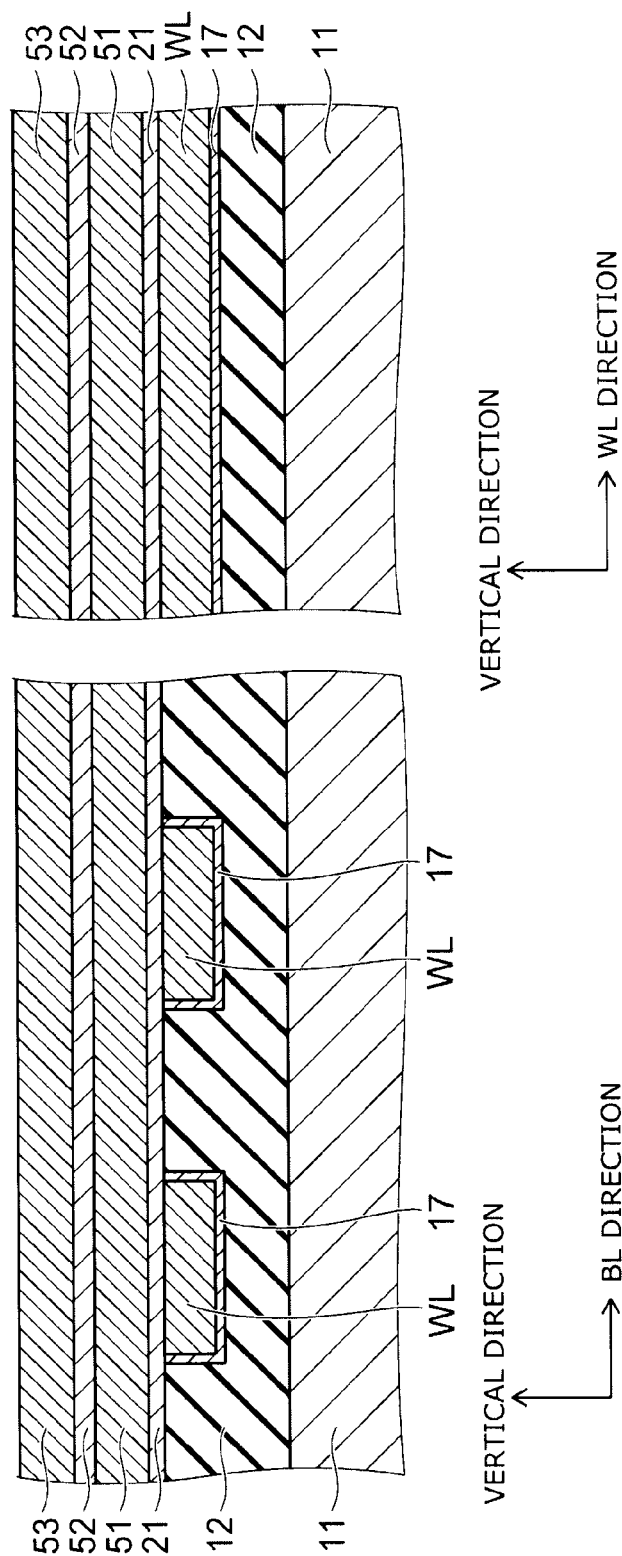
FIGS. 14A and 14B are process cross-sectional views illustrating a method for manufacturing a semiconductor memory device according to a variation of the first embodiment.

FIGS. 14A and 14B are process cross-sectional views illustrating a method for manufacturing the semiconductor memory device according to the variation; FIG. 14A illustrates a cross section parallel to the BL direction, and FIG. 14B illustrates a cross section parallel to the WL direction.

In comparison with the first embodiment, the variation differs in the method of forming the selector stacked film.

As illustrated in FIGS. 14A and 14B, in the variation, the barrier metal film 21 is formed, and then a non-doped amorphous silicon layer 51 having a thickness of, for example, about 20 to 50 nm is formed by chemical vapor deposition (CVD) method using $SiH_4$ or $Si_2H_6$ gas as the raw material. And then, $SiH_4$ gas and $GeH_4$ gas are supplied to the chamber of CVD apparatus under a pressure of about 0.3 kPa for about 10 minutes, and thus a silicon-germanium layer 52 is formed on the amorphous silicon layer 51. In this operation, it is preferable that the flow rate of $GeH_4$ gas to the total flow rate of gases supplied to the chamber, that is, the total flow rate of $SiH_4$ gas and $GeH_4$ gas, is regulated to 20% or more. This condition allows the increase in the germanium concentration in the silicon-germanium layer 52. After that, the CVD method is continuously applied to form a non-doped amorphous silicon layer 53 having a thickness of for example about 20 to 50 nm. In this way, by the in-situ doping, germanium is introduced into a part of the amorphous silicon layer. In the succeeding process, crystallization-annealing is applied to convert the amorphous silicon layer 51 into the polycrystalline non-doped silicon layer 31 (refer to FIGS. 3A and 3B), the amorphous silicon-germanium layer 52 is converted into the polycrystalline silicon-germanium layer 32 (refer to FIGS. 3A and 3B), and the amorphous silicon layer 53 is converted into the polycrystalline non-doped silicon layer 33 (refer to FIGS. 3A and 3B). In the variation, the manufacturing method, the structure, the operation and effect other than those described above are the same as those in the first embodiment.

Second to seventh embodiments described below are the embodiments having different structures of the selector stacked film in comparison with the structure of the first embodiment. In the description of the second to seventh embodiments and variations thereof, the description of the same contents as those of the first embodiment is omitted.

The second embodiment is described below.

Figures 15A, 15B:
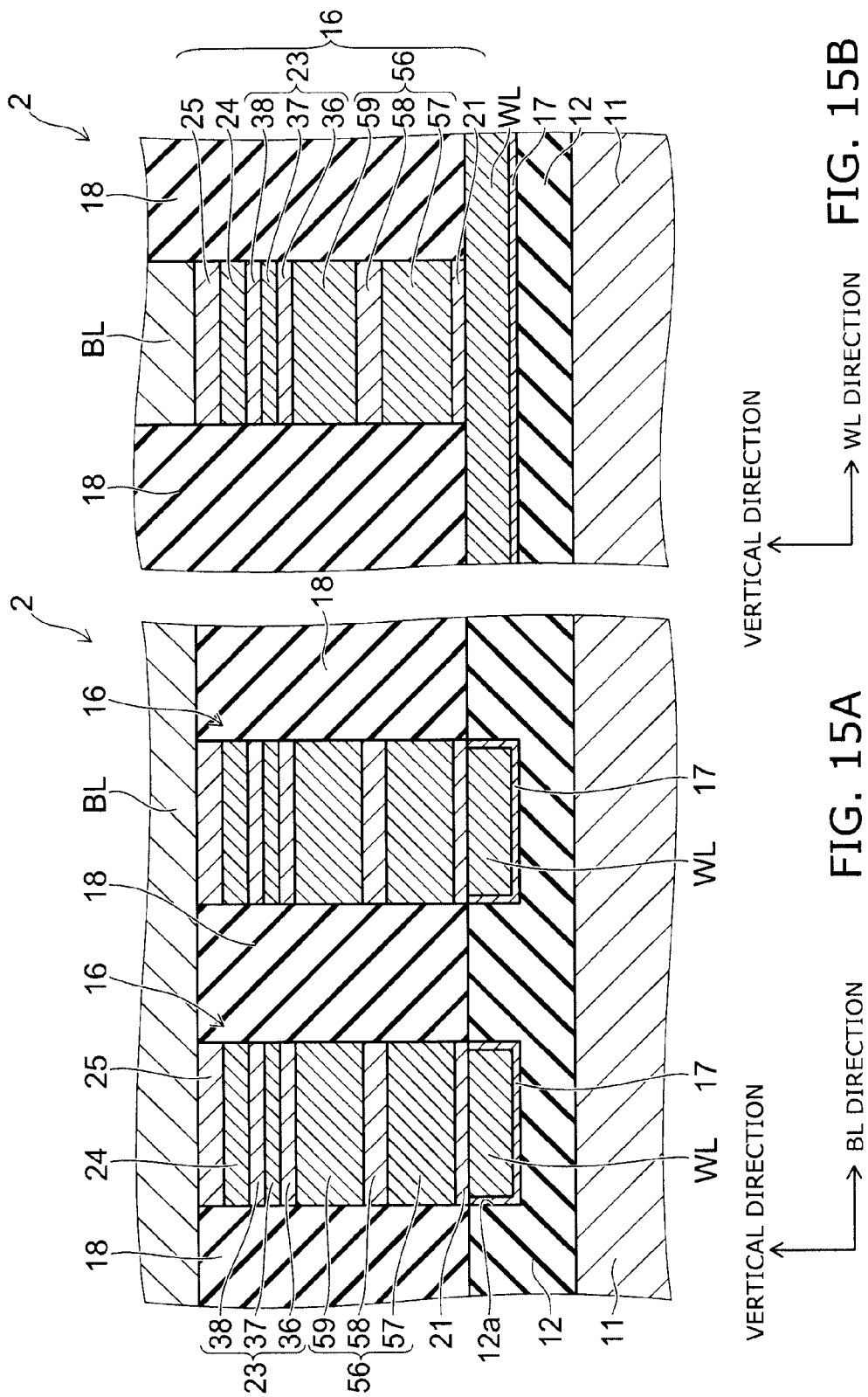
FIGS. 15A and 15B are cross-sectional views illustrating a pillar and surrounding area thereof of a second embodiment.

FIGS. 15A and 15B are cross-sectional views illustrating the pillar and surrounding area thereof in the embodiment; FIG. 15A illustrates a cross section parallel to the BL direction, and FIG. 15B illustrates a cross section parallel to the WL direction.

Figure 16A:
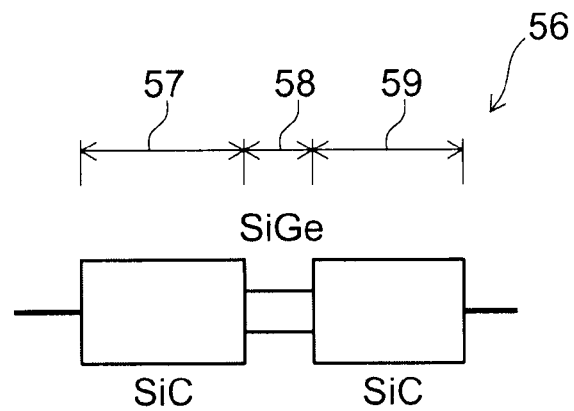
FIGS. 16A to 16C are schematic band diagrams illustrating the operation of the selector stacked film of the second embodiment.
Figure 16B:
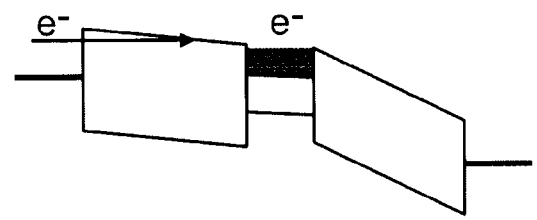
Figure 16C:
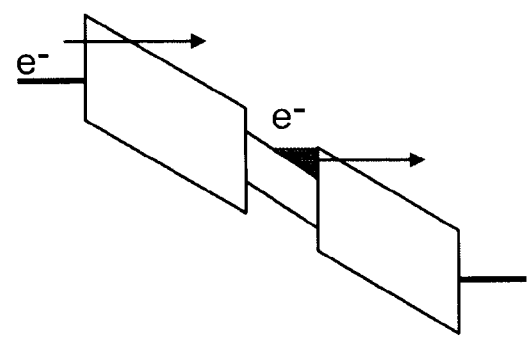

FIGS. 16A to 16C are schematic band diagrams illustrating the operation of the selector stacked film of the embodiment; the horizontal axis represents the position in the vertical direction, and the vertical axis represents the energy. FIG. 16A is the case where the applied voltage is 0 (zero), FIG. 16B is the case where the applied voltage is low, and FIG. 16C is the case where the applied voltage is high.

As illustrated in FIGS. 15A and 15B, compared with the first embodiment, a semiconductor memory device 2 according to the embodiment has a selector stacked film 56 instead of the selector stacked film 22 (refer to FIGS. 3A and 3B). In the selector stacked film 56, there are stacked, from lower layer to upper layer, a silicon carbide layer 57 made of silicon carbide (SiC), a silicon-germanium layer 58, and a silicon carbide layer 59. The thickness of the silicon carbide layer 57 is, for example, about 50 to 130 nm. The thickness of the silicon carbide layer 59 is, for example, about 20 to 50 nm. Both of the silicon carbide layers have polycrystalline structure.

Next, a description will be given of a method for manufacturing semiconductor memory device of the embodiment.

After forming the barrier metal film 21, a carbon-doped amorphous silicon layer having a thickness of, for example, about 50 to 130 nm is formed by the CVD method using $SiH_4$ or $Si_2H_6$ gas, and $C_2H_4$ gas as the raw materials. Successively, $SiH_4$ gas or $Si_2H_6$ gas, and $GeH_4$ gas are supplied to the chamber of CVD apparatus under a pressure of about 0.3 kPa for about 10 min, and thus a silicon-germanium layer is formed on the carbon-doped amorphous silicon layer. And then, there is successively formed a carbon-doped amorphous silicon layer having a thickness of, for example, about 20 to 50 nm by the CVD method using $SiH_4$ gas or $Si_2H_6$ gas, and $C_2H_4$ gas as the raw materials. Then, nitrogen-annealing is applied in a nitrogen atmosphere at about, for example, 700° C. to 800° C., and thus a SiC bond is formed in the carbon-doped amorphous silicon layer. The operation converts the carbon-doped amorphous silicon layer into the polycrystalline silicon carbide layers 57 and 59, respectively. Furthermore, the silicon-germanium layer becomes the polycrystalline silicon-germanium layer 58.

Compared with the silicon-germanium (SiGe), the silicon carbide (SiC) has wide band gap, and thus, when applying a low voltage, the silicon-germanium layer 58 can accumulate a larger amount of charge than in the first embodiment. As a result, when the applied voltage exceeds a certain value, the current can be steeply increased. In the second embodiment, the structure, the manufacturing method, the operation and effect other than those described above are the same as those in the first embodiment.

Next, a description will be given of a variation of the second embodiment.

The variation differs from the second embodiment in the method of forming the selector stacked film.

According to the variation, after forming the carbon-doped amorphous silicon layer having a thickness of, for example, about 50 to 130 nm by the CVD method using $SiH_4$ or $Si_2H_6$ gas, and $C_2H_4$ gas, the supply of $C_2H_4$ gas is stopped to form a non-doped amorphous silicon layer. Then, a carbon-doped amorphous silicon layer having a thickness of, for example, about 20 to 50 nm is formed. Successively, ion implantation is performed to introduce germanium into the non-doped amorphous silicon layer. As a result, the non-doped amorphous silicon layer becomes the silicon-germanium layer. In the variation, the manufacturing method, the structure, the operation and effect other than those described above are the same as those in the second embodiment.

Next, a description will be given of a third embodiment.

Figures 17A, 17B:
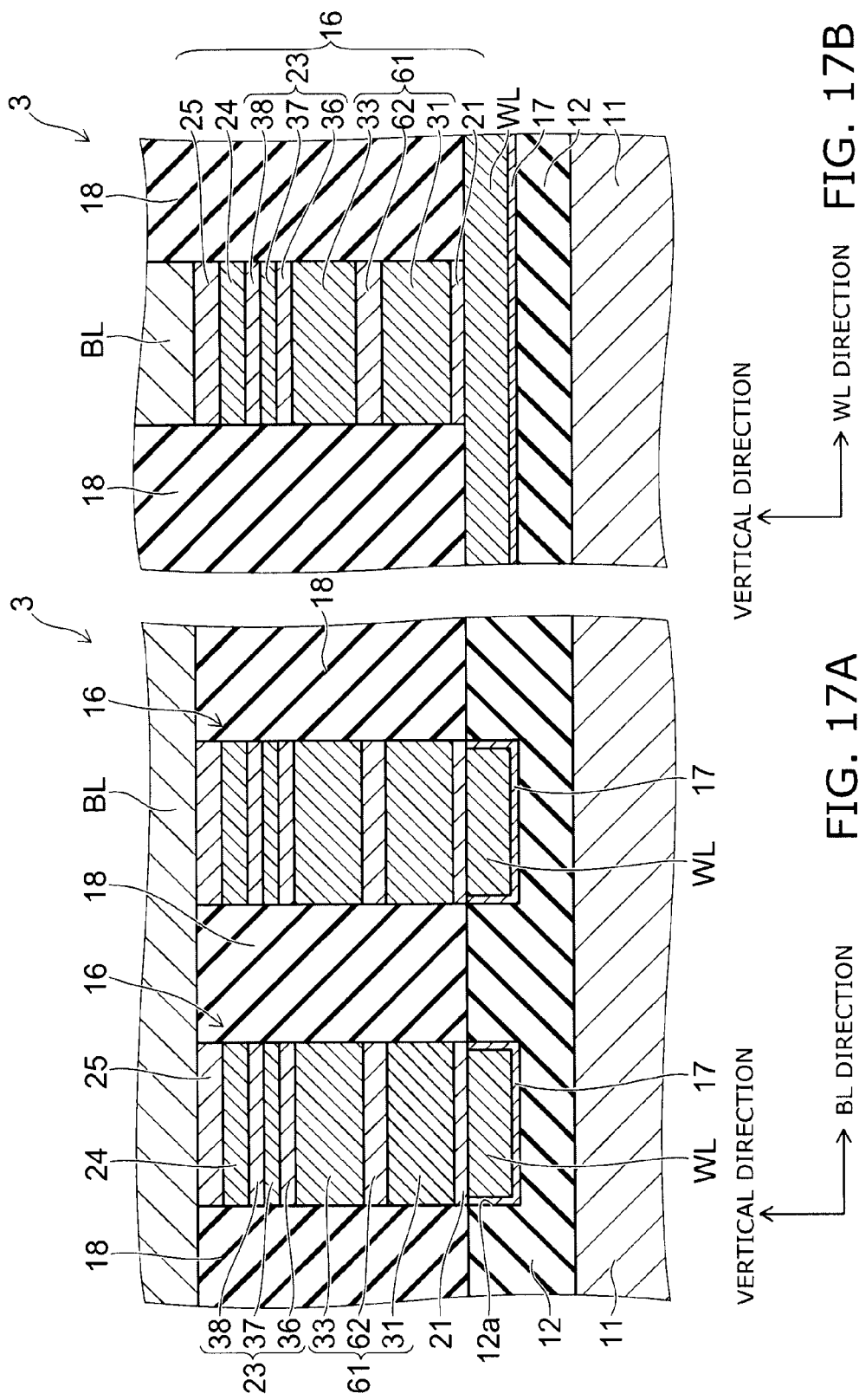
FIGS. 17A and 17B are cross-sectional views illustrating a pillar and surrounding area thereof of a third embodiment.

FIGS. 17A and 17B are cross-sectional views illustrating the pillar and surrounding area thereof in the embodiment; FIG. 17A illustrates a cross section parallel to the BL direction, and FIG. 17B illustrates a cross section parallel to the WL direction.

Figure 18A:
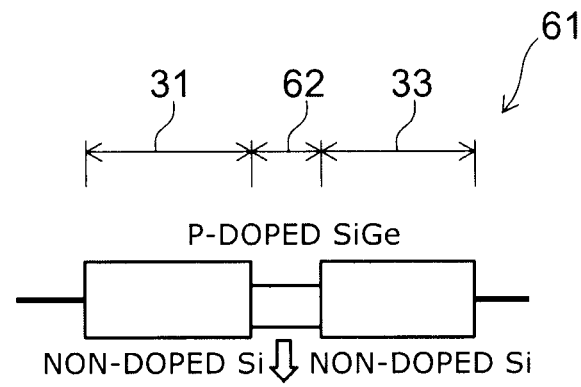
FIGS. 18A to 18C are schematic band diagrams illustrating the operation of the selector stacked film of the third embodiment.
Figure 18B:
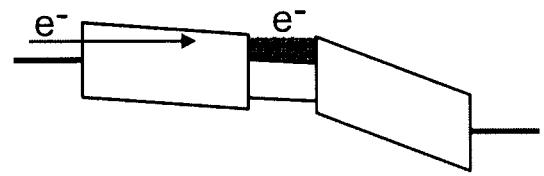
Figure 18C:
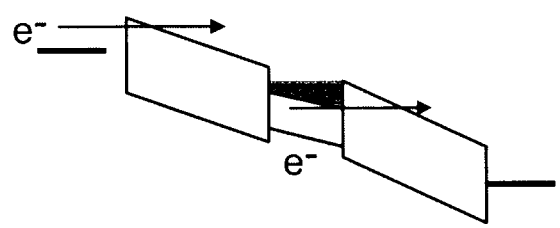

FIGS. 18A to 18C are schematic band diagrams illustrating the operation of the selector stacked film in the embodiment; the horizontal axis represents the position in the vertical direction, and the vertical axis represents the energy. FIG. 18A is the case where the applied voltage is 0 (zero), FIG. 18B is the case where the applied voltage is low, and FIG. 18C is the case where the applied voltage is high.

As illustrated in FIGS. 17A and 17B, a semiconductor memory device 3 according to the embodiment differs from the first embodiment in that, in a selector stacked film 61, a phosphorus (P)-doped silicon-germanium layer 62 is adopted instead of the silicon-germanium layer 32 (refer to FIGS. 3A and 3B). That is, in the selector stacked film 61, there are stacked, in order from the lower layer to the upper layer, the non-doped silicon layer 31, the polycrystalline phosphorus-doped silicon-germanium layer 62, and the non-doped silicon layer 33.

Next, a description will be given of a method for manufacturing the semiconductor memory device according to the embodiment.

After forming the barrier metal film 21, a non-doped amorphous silicon layer having a thickness of, for example, about 20 to 50 nm is formed by the CVD method. Successively, $PH_3$ gas and $GeH_4$ gas are supplied to the chamber of CVD apparatus under a pressure of about 0.3 kPa for about 10 min, thus to cause phosphorus atoms and germanium atoms to be adsorbed on the upper face of the non-doped amorphous silicon layer and diffuse these atoms thereinto. As a result, there is formed a phosphorus-doped silicon-germanium layer on the upper layer part of the amorphous silicon layer. Then, the CVD method is applied to form a non-doped amorphous silicon layer having a thickness of, for example, about 20 to 50 nm. In this procedure, the gas-phase doping is formed to introduce germanium and phosphorus into the silicon layer. In the succeeding process, by performing crystallization-annealing, the non-doped amorphous silicon layer at the lower layer side becomes the polycrystalline non-doped silicon layer 31, the amorphous phosphorus-doped silicon-germanium layer becomes the polycrystalline phosphorus-doped silicon-germanium layer 62, and the non-doped amorphous silicon layer at the upper layer side becomes the polycrystalline non-doped silicon layer 33.

As illustrated in FIGS. 18A to 18C, according to the embodiment, the phosphorus-doped silicon-germanium layer 62 is positioned instead of the silicon-germanium layer 32 (refer to FIG. 10), which differs from the first embodiment. Since phosphorus functions as a donor with respect to silicon, the Fermi level of the phosphorus-doped silicon-germanium layer 62 increases, which allows electrons to accumulate in larger amounts. As a result, the energy level of the phosphorus-doped silicon-germanium layer 62 increases, and thus the effect of tilting the band of the non-doped silicon layer 33 is further improved. Consequently, the quantity of current when applying a low voltage can further be effectively suppressed. In the embodiment, the manufacturing method, the structure, the operation and effect other than those described above are the same as those in the first embodiment.

Next, a description will be given of a first variation of the third embodiment.

The variation differs from the third embodiment in that, in forming the selector stacked film 61, germanium is introduced by ion implantation instead of gas-phase doping.

According to the variation, after forming the non-doped amorphous silicon layer on the barrier metal film 21, $SiH_4$ gas and $PH_3$ gas are simultaneously supplied under a pressure of about 0.3 kPa for about 10 minutes to form the phosphorus-doped silicon layer. Next, the non-doped silicon layer is formed. Then, ion implantation is performed to implant germanium into the phosphorus-doped silicon layer. After that, heat treatment is performed. By the procedure, the selector stacked film 61 structured by stacking the non-doped silicon layer 31, the phosphorus-doped silicon-germanium layer 62, and the non-doped silicon layer 33 are formed. In the variation, the manufacturing method, the structure, the operation and effect other than those described above are the same as those in the third embodiment.

Next, a description will be given of a second variation of the third embodiment.

The variation differs from the third embodiment in that, when forming the selector stacked film 61, phosphorus is introduced by ion-implantation instead of gas-phase doping.

That is, according to the variation, after forming the non-doped amorphous silicon layer on the barrier metal film 21, the silicon-germanium layer is formed by simultaneously supplying $SiH_4$ gas and $GeH_4$ gas under a pressure of about 0.3 kPa for about 10 minutes. Then, the non-doped amorphous silicon layer is formed. After that, ion implantation is performed to implant phosphorus into the silicon-germanium layer. Then, heat treatment is performed. By the procedure, the selector stacked film 61 structured by the non-doped silicon layer 31, the phosphorus-doped silicon-germanium layer 62, and the non-doped silicon layer 33 are formed. In the variation, the manufacturing method, the structure, the operation and effect other than those described above are the same as those in the third embodiment.

The third embodiment and the first and second variations thereof show an introduction example of phosphorus as a donor. The phosphorus as a donor is not specifically limited. The impurities to be introduced are only required to act as a donor with respect to silicon and, for example, the impurities may be arsenic (As).

Next, a description will be given of a fourth embodiment.

Figure 19A:
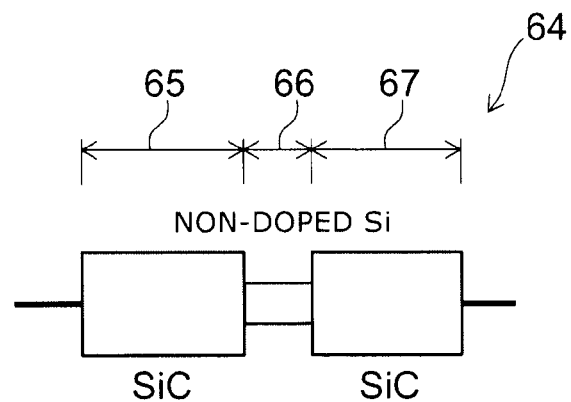
FIGS. 19A to 19C are schematic band diagrams illustrating the operation of the selector stacked film of a fourth embodiment.
Figure 19B:
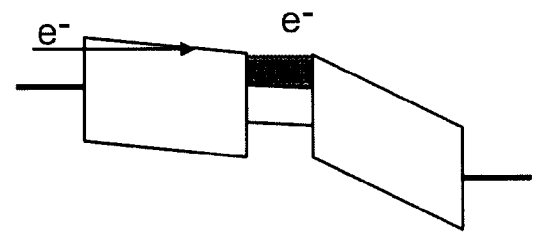
Figure 19C:
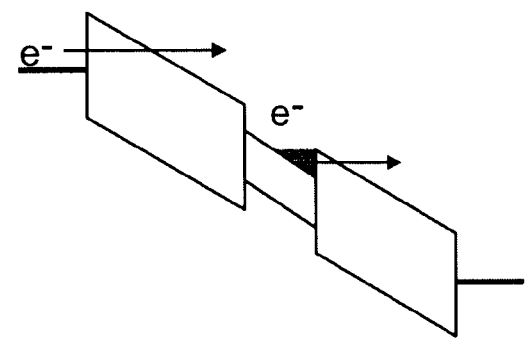

FIGS. 19A to 19C are schematic band diagrams illustrating the operation of the selector stacked film in the fourth embodiment; the horizontal axis represents the position in the vertical direction, and the vertical axis represents the energy. FIG. 19A is the case where the applied voltage is 0 (zero), FIG. 19B is the case where the applied voltage is low, and FIG. 19C is the case where the applied voltage is high.

According to the semiconductor memory device according to the embodiment, a selector stacked film 64 is structured by stacking, in order from the lower layer to the upper layer, a silicon carbide layer 65, a non-doped silicon layer 66, and a silicon carbide layer 67, as illustrated in FIGS. 19A to 19C. Since silicon carbide (SiC) has wider band gap than that of silicon (Si), the non-doped silicon layer 66 being sandwiched between the silicon carbide layers 65 and 67 can accumulate charge. Consequently, similar to the first embodiment, when applying a low voltage to the selector stacked film 64, the current is suppressed by flowing therethrough, and when applying a high voltage thereto, a large current is allowed to flow therethrough. In the embodiment, the structure, the manufacturing method, the operation and effect other than those described above are the same as those in the first embodiment.

Next, a description will be given of a fifth embodiment.

Figure 20A:
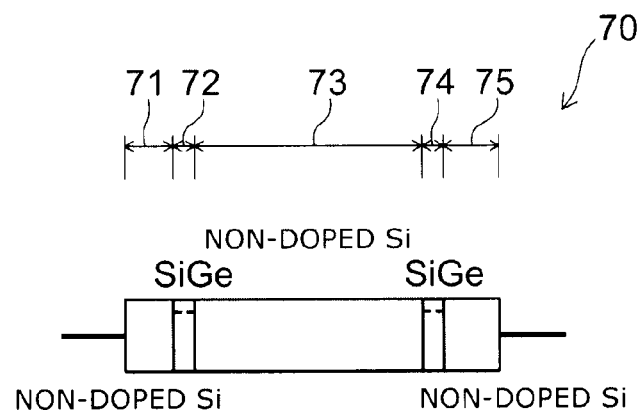
FIGS. 20A to 20C are schematic band diagrams illustrating the operation of the selector stacked film of a fifth embodiment.
Figure 20B:
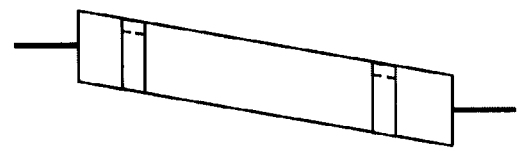
Figure 20C:
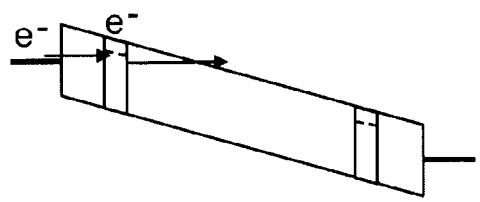

FIGS. 20A to 20C are schematic band diagrams illustrating the operation of the selector stacked film in the embodiment; the horizontal axis represents the position in the vertical direction, and the vertical axis represents the energy. FIG. 20A is the case where the applied voltage is 0 (zero), FIG. 20B is the case where the applied voltage is low, and FIG. 20C is the case where the applied voltage is high.

As illustrated in FIGS. 20A to 20C, the semiconductor memory device according to the embodiment has a selector stacked film 70. The selector lamination layer 70 is structured by stacking, in order from lower layer to upper layer, a non-doped silicon layer 71, a silicon-germanium layer 72, a non-doped silicon layer 73, a silicon-germanium layer 74, and a non-doped silicon layer 75. All these layers have polycrystalline structure. That is, entire selector stacked film 70 contains silicon, and the silicon-germanium layers 72 and 74 are formed in the respective domains separated from each other, except for the lower end and the upper end of the selector stacked film 70. For example, in the vertical direction, the thickness of entire selector stacked film 70 is in a range from about 50 to about 130 nm, the center of the silicon-germanium layer 72 is positioned at about 10 nm distant from the lower end of the selector stacked film 70, and the center of the silicon-germanium layer 74 is positioned at about 10 nm distant from the upper end of the selector stacked film 70. Furthermore, the germanium concentration in the silicon-germanium layers 72 and 74 is lower than that in the silicon-germanium layer 32 (refer to FIGS. 13A to 13C) in the first embodiment.

Next, a description will be given of a method for manufacturing the semiconductor memory device according to the fifth embodiment.

According to the embodiment, the selector stacked film 70 is formed by ion implantation. That is, after forming a non-doped amorphous silicon layer on the barrier metal film 21 (refer to FIGS. 3A and 3B), the implantation of germanium is given by two times with different acceleration voltage from each other, and thus the silicon-germanium layers 72 and 74 are formed. At that moment, the portions in which the germanium is not implanted on the amorphous silicon layer become the respective non-doped silicon layers 71, 73, and 75. After that, heat treatment is performed to thereby crystallize these layers.

Since germanium is the same 14 group element as silicon, germanium atom occupies a lattice point of silicon crystal. And since the atomic radius of germanium is larger than that of silicon, the germanium atom deforms the surrounding crystal lattice. However, the silicon-germanium layers 72 and 74 have relatively low germanium concentration, and thus these layers are like germanium-added silicon layers. Therefore, the germanium atoms behave as if they are defect levels in the silicon-germanium layers 72 and 74. As a result, there is formed an electron-trap level in the silicon-germanium layers 72 and 74. Consequently, when a voltage of a certain value or more is applied to the silicon-germanium layers 72 and 74, a tunnel current begins to flow via the trap level. That is, the silicon-germanium layers 72 and 74 give trap-assist for the tunnel current, and thus the tunneling probability increases and the tunnel current increases. As a result, when the voltage applied to the selector stacked film 70 exceeds a certain value, the current flowing through the selector stacked film 70 begins to abruptly increase. When the germanium concentration in the silicon-germanium layers 72 and 74 is excessively increased, the number of trap levels becomes excessively large, which increases the leak current at the time of applying low voltage. Therefore, the germanium concentration in the silicon-germanium layers 72 and 74 is preferably not excessively increased. In the embodiment, the structure, the manufacturing method, the operation and effect other than those described above are the same as those in the embodiment.

Next, a description will be given of a first variation of the fifth embodiment.

In the variation, the introduction of germanium is performed by gas-phase doping, different from in the case of the fifth embodiment.

That is, in the variation, the non-doped amorphous silicon layer is formed on the barrier metal layer 21. Then, $GeH_4$ gas is supplied under a pressure of about 1 kPa for about 10 minutes to cause germanium to adsorb onto the top surface of the non-doped amorphous silicon layer. As a result, gas phase doping is performed to thereby form a germanium-adsorbed layer in the upper layer part of the non-doped amorphous silicon layer. Next, this process is repeated one more time. That is, the non-doped amorphous silicon layer is formed, and then $GeH_4$ gas is supplied to form the germanium-adsorbed layer, and then the non-doped amorphous silicon layer is formed. After that, heat treatment is performed to thereby crystallize these layers. In the variation, the manufacturing method, the structure, the operation and effect other than those described above are the same as those in the fifth embodiment.

Next, a description will be given of a second variation of the fifth embodiment.

The variation differs from the fifth embodiment and the first variation of the fifth embodiment in that the doping of germanium is executed by in-situ doping.

That is, according to the variation, the non-doped amorphous silicon layer is formed on the barrier metal film 21. Then, GeH$_4$ gas and SiH$_4$ gas are simultaneously supplied under a pressure of about 0.1 kPa for about 10 minutes to thereby form the silicon-germanium layer on the non-doped amorphous silicon layer. And then, the non-doped amorphous silicon layer is formed, followed by supplying GeH$_4$ gas and SiH$_4$ gas simultaneously under a pressure of about 0.1 kPa for about 10 minutes to thereby form the silicon-germanium layer. Next, the non-doped amorphous silicon layer is formed. After that, heat treatment is performed to crystallize these layers. Compared with the gas-phase doping, in-situ doping is easy for controlling the germanium concentration. In the variation, the manufacturing method, the structure, the operation and effect other than those described above are the same as those in the fifth embodiment.

Next, a description will be given of a sixth embodiment.

Figure 21A:
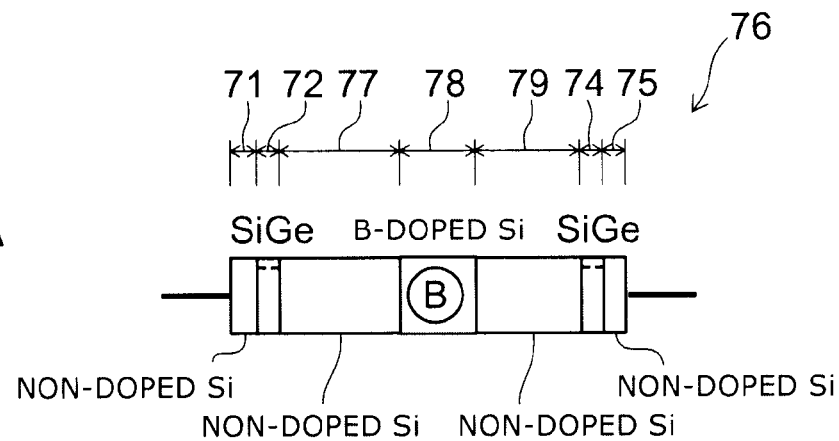
FIGS. 21A to 21C are schematic band diagrams illustrating the operation of the selector stacked film of a sixth embodiment.
Figure 21B:
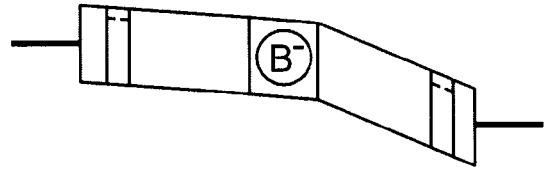
Figure 21C:
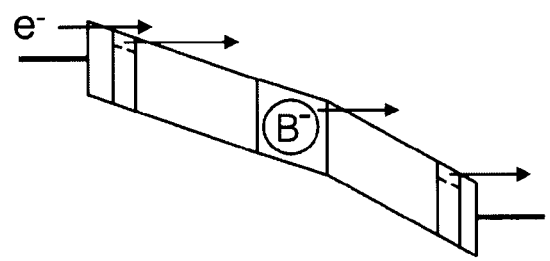

FIGS. 21A to 21C are schematic band diagrams illustrating the operation of the selector stacked film in the embodiment; the horizontal axis is the position in the vertical direction, and the vertical axis is the energy. FIG. 21A is the case where the applied voltage is 0 (zero), FIG. 21B is the case where the applied voltage is low, and FIG. 21C is the case where the applied voltage is high.

As illustrated in FIGS. 21A to 21C, the embodiment forms a boron-doped silicon layer between two silicon-germanium layers, in addition to the structure of the fifth embodiment. That is, in a selector stacked film 76 of the sixth embodiment, there are stacked, from lower layer to upper layer, the non-doped silicon layer 71, the silicon-germanium layer 72, a non-doped silicon layer 77, a boron-doped silicon layer 78, a non-doped silicon layer 79, the silicon-germanium layer 74, and the non-doped silicon layer 75. All of these layers have polycrystalline structure. For example, the boron-doped silicon layer 78 is formed at center of the selector stacked film 76 in the vertical direction.

The boron-doped silicon layer 78 can be formed by doping boron (B) into the non-doped silicon layer by using ion implantation. Alternatively, the boron may be doped by gas-phase doping. In the latter case, BCl$_3$ gas is supplied under a pressure of about 0.3 kPa for about 10 minutes to allow boron to be adsorbed on the top surface of the amorphous silicon layer. Alternatively, in-situ doping may be applied to form the boron-doped silicon layer 78. In that case, simultaneous supply of SiH$_4$ gas and BCl$_3$ gas under a pressure of about 0.3 kPa for about 10 minutes can form the boron-doped silicon layer 78.

Next, a description will be given of the operation and effect of the embodiment.

The embodiment provides the following-described effect, in addition to the effect of the fifth embodiment. As illustrated in FIG. 21A, the band gap of the boron-doped silicon layer 78 is the same as that of the non-doped silicon layer 71 and the like. Because, however, boron functions as an acceptor with respect to silicon, a hole is generated in the boron-doped silicon layer 78. As illustrated in FIG. 21B, when a low voltage is applied to the selector stacked film 76, the hole in the boron-doped silicon layer 78 is eliminated and thus, boron ion (B$^-$) is left. As a result, the boron-doped silicon layer 78 is charged to negative potential, which increases the energy level with respect to electrons. Consequently, current becomes difficult to flow. As illustrated in FIG. 21C, when the applied voltage is further increased, the tilt of band of entire selector stacked film 76 increases, and thus, the effect of increasing the energy level of the boron-doped silicon layer 78 is lowered. As a result, a large current flows. By this procedure, also the embodiment can realize a selector stacked film which suppresses current when low voltage is applied and which allows large current to flow when high voltage is applied. In the embodiment, the structure, the manufacturing method, the operation and effect other than those described above are the same as those in the fifth embodiment.

Next, a description will be given of a seventh embodiment.

Figure 22A:
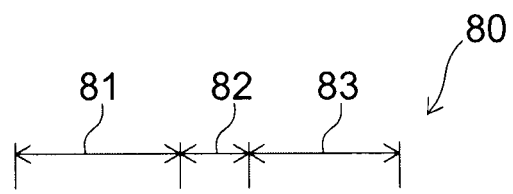
FIGS. 22A to 22C are schematic band diagrams illustrating the operation of the selector stacked film of a seventh embodiment.
Figure 22B:
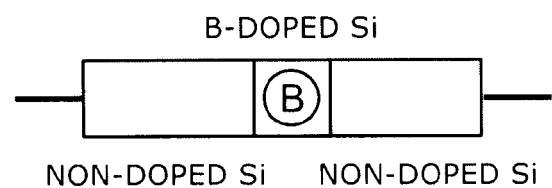
Figure 22C:
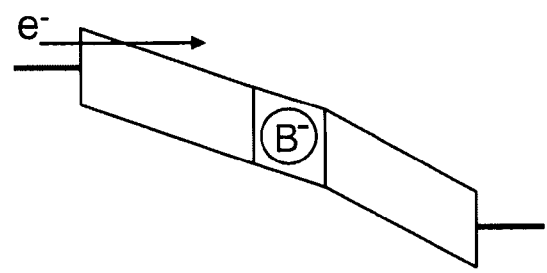

FIGS. 22A to 22C are schematic band diagrams illustrating the operation of the selector stacked film in the embodiment; the horizontal axis is the position in the vertical direction, and the vertical axis is the energy. FIG. 22A is the case where the applied voltage is 0 (zero), FIG. 22B is the case where the applied voltage is low, and FIG. 22C is the case where the applied voltage is high.

As illustrated in FIGS. 22A to 22C, in a selector stacked film 80 of the embodiment, there are formed, in order from lower layer to upper layer, a non-doped silicon layer 81, a boron-doped silicon layer 82, and a non-doped silicon layer 83. For example, the boron-doped silicon layer 81 is formed at center of the selector stacked film 80 in the vertical direction.

The method of forming the boron-doped silicon layer 82 is similar to the method of forming the boron-doped silicon layer 78 (refer to FIGS. 21A to 21C) in the sixth embodiment. The effect of forming the boron-doped silicon layer 82 is similar to that of forming the boron-doped silicon layer 78 in the sixth embodiment. In the embodiment, the structure, the manufacturing method, the operation and effect other than those described above are the same as those in the first embodiment.

Note that the sixth embodiment and the seventh embodiment give examples of doping of boron as an acceptor. This invention is, however, not limited to the examples. If only the impurities to be introduced are those acting as an acceptor with respect to silicon, the impurities may be, for example, aluminum (Al), gallium (Ga), or indium (In).

Furthermore, the above embodiments give examples of forming the silicon-germanium layer by introducing germanium into the silicon layer. This invention is, however, not limited to the examples. That is, other than germanium, any element of the 14 group having a larger atomic radius than that of silicon can provide similar effects by introducing thereof into the silicon layer.

According to the above-described embodiments, there can be realized a semiconductor memory device suitable for bipolar action.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
a word line interconnect layer including a plurality of word lines extending in a first direction;
a bit line interconnect layer including a plurality of bit lines extending in a second direction intersecting with the first direction; and
a pillar disposed between each of the word lines and each of the bit lines,
the pillar having
a selector stacked film containing silicon throughout the selector stacked film, and
a variable resistance film disposed on a side of the word lines or the bit lines viewed from the selector stacked film, and
the selector stacked film having a different component-containing layer, the different component-containing layer being formed at one position in a region excluding an end on the side of the word lines and an end on the side of the bit lines, and containing a 14 group element having a larger atomic radius than an atomic radius of silicon, and
portions of the selector stacked film other than the different component-containing layer are made of silicon carbide.

2. The device according to claim 1, wherein the different component-containing layer contains an element serving as a donor with respect to silicon.

3. The device according to claim 2, wherein the element serving as a donor with respect to silicon is phosphorus.

4. The device according to claim 1, wherein the 14 group element having a larger atomic number than an atomic number of silicon is germanium.

5. The device according to claim 1, further comprising an electrode disposed between the selector stacked film and the variable resistance film, and having a titanium silicide layer, a titanium layer, and a titanium nitride layer stacked in order from a side of the selector stacked film.

6. A semiconductor memory device comprising:
a word line interconnect layer including a plurality of word lines extending in a first direction;
a bit line interconnect layer including a plurality of bit lines extending in a second direction intersecting with the first direction; and
a pillar disposed between each of the word lines and each of the bit lines,
the pillar having
a selector stacked film containing silicon throughout the selector stacked film,
a variable resistance film disposed on a side of the word lines or the bit lines viewed from the selector stacked film, and
an electrode disposed between the selector stacked film and the variable resistance film, and having a titanium silicide layer, a titanium layer, and a titanium nitride layer stacked in order from a side of the selector stacked film, and
the selector stacked film having a different component-containing layer, the different component-containing layer being formed at one position in a region excluding an end on the side of the word lines and an end on the side of the bit lines, and containing an element serving as an acceptor with respect to silicon.

7. The device according to claim 6, wherein the element serving as an acceptor with respect to silicon is boron.

8. A semiconductor memory device comprising:
a word line interconnect layer including a plurality of word lines extending in a first direction;
a bit line interconnect layer including a plurality of bit lines extending in a second direction intersecting with the first direction; and
a pillar disposed between each of the word lines and each of the bit lines,
the pillar having
a selector stacked film containing silicon throughout the selector stacked film, and
a variable resistance film disposed on a side of the word lines or the bit lines viewed from the selector stacked film, and
the selector stacked film having a different component-containing layer, the different component-containing layer being formed at one position in a region excluding an end on the side of the word lines and an end on the side of the bit lines, and containing a 14 group element having a larger atomic radius than an atomic radius of silicon, and
portions of the selector stacked film other than the different component-containing layer being made of non-doped silicon.

9. The device according to claim 8, wherein the different component-containing layer contains an element serving as a donor with respect to silicon.

10. The device according to claim 8, wherein the element serving as a donor with respect to silicon is phosphorus.

11. The device according to claim 8, wherein the 14 group element having a larger atomic number than an atomic number of silicon is germanium.

12. A semiconductor memory device comprising:
a word line interconnect layer including a plurality of word lines extending in a first direction;
a bit line interconnect layer including a plurality of bit lines extending in a second direction intersecting with the first direction; and
a pillar disposed between each of the word lines and each of the bit lines,
the pillar having
a selector stacked film containing silicon throughout the selector stacked film, and
a variable resistance film disposed on a side of the word lines or the bit lines viewed from the selector stacked film, and
an electrode disposed between the selector stacked film and the variable resistance film, and having a titanium silicide layer, a titanium layer, and a titanium nitride layer stacked in order from a side of the selector stacked film, and
the selector stacked film having a different component-containing layer, the different component-containing layer being formed at one position in a region excluding an end on the side of the word lines and an end on the side of the bit lines, and containing a 14 group element having a larger atomic radius than an atomic radius of silicon.

13. The device according to claim 12, wherein portions of the selector stacked film other than the different component-containing layer are made of non-doped silicon.

14. The device according to claim 12, wherein the different component-containing layer contains an element serving as a donor with respect to silicon.

15. The device according to claim 14, wherein the element serving as a donor with respect to silicon is phosphorus.

16. The device according to claim 12, wherein the 14 group element having a larger atomic number than an atomic number of silicon is germanium.

* * * * *